United States Patent
Li et al.

(10) Patent No.: US 10,637,498 B1
(45) Date of Patent: Apr. 28, 2020

(54) ACCELERATED COMPRESSION METHOD AND ACCELERATED COMPRESSION APPARATUS

(71) Applicant: Shanghai Zhaoxin Semiconductor Co., Ltd., Shanghai (CN)

(72) Inventors: Lin Li, Beijing (CN); Zheng Wang, Beijing (CN); Xiaoyang Li, Beijing (CN); Zongpu Qi, Beijing (CN)

(73) Assignee: Shanghai Zhaoxin Semiconductor Co., Ltd., Shanghai (CN)

( * ) Notice: Subject to any disclaimer, the term of this patent is extended or adjusted under 35 U.S.C. 154(b) by 0 days.

(21) Appl. No.: 16/430,448

(22) Filed: Jun. 4, 2019

(30) Foreign Application Priority Data

Jan. 30, 2019 (CN) .......................... 2019 1 0092001

(51) Int. Cl.
*H03M 7/30* (2006.01)
*G06F 16/2455* (2019.01)

(52) U.S. Cl.
CPC .... *H03M 7/3084* (2013.01); *G06F 16/24558* (2019.01); *H03M 7/6029* (2013.01)

(58) Field of Classification Search
CPC .............. H03M 7/3084; H03M 7/6029; G06F 16/24558

USPC .......................................... 341/51, 106, 107
See application file for complete search history.

(56) References Cited

U.S. PATENT DOCUMENTS

| | | | |
|---|---|---|---|
| 9,965,570 B2 * | 5/2018 | Chen | G06F 16/90344 |
| 10,002,010 B2 * | 6/2018 | Craik | G06F 9/45504 |
| 10,070,145 B2 * | 9/2018 | Ye | H04N 19/593 |
| 10,509,580 B2 * | 12/2019 | Yap | H03M 7/30 |

* cited by examiner

*Primary Examiner* — Brian K Young
(74) *Attorney, Agent, or Firm* — JCIPRNET

(57) ABSTRACT

An accelerated compression method and apparatus are provided. The accelerated compression apparatus includes a look-ahead buffer, a string matching processing pipeline and a control circuit. A string to be compressed extracted from the data register is stored to the look-ahead buffer. P instances are issued in parallel from the look-ahead buffer. When P substrings corresponding to the P instances issued in a first issue cycle are identical, the control circuit sends a first instance and a second instance of the P instances to the string matching processing pipeline for a matching operation and does not send the remaining instances of these P instances to the string matching processing pipeline. In consecutive issue cycles after the first issue cycle, the control circuit does not send any of the P instances to the string matching processing pipeline until the P substrings corresponding to the P instances are not identical.

20 Claims, 11 Drawing Sheets

ACCELERATED COMPRESSION METHOD AND ACCELERATED COMPRESSION APPARATUS

CROSS-REFERENCE TO RELATED APPLICATION

This application claims the priority benefit of China application serial no. 201910092001.6, filed on Jan. 30, 2019. The entirety of the above-mentioned patent application is hereby incorporated by reference herein and made a part of this specification.

BACKGROUND

1. Field of the Invention

The invention relates to an accelerated apparatus, and more particularly, relates to an accelerated compression method and an accelerated compression apparatus for performing a hardware acceleration in compression operations.

2. Description of Related Art

A compression accelerator is a hardware specifically designed to assist in performing compression/decompression. The compression accelerator generally adopts use of dictionary-based compression algorithms (e.g., LZ77, LZSS, LZ78 or LZW algorithms). Position information (including a matched length and a matched offset) in a dictionary (i.e., a sliding window) is used to replace raw data, so as to achieve a data compression. For the compression accelerator, the most complicated part is performing a longest-prefix string matching, and the longest-prefix string matching can usually be classified as a content-based addressable memory (CAM-based) method and a hash-based method.

For example, a hash-based string matcher usually converts a plurality of characters (hash keys) in a string to be compressed into hash values by using a hash circuit. The hash circuit then performs table look-up and comparison on a hash table according to the hash values. If the hash value corresponding to the hash key appears in the hash table, it means that the content of the dictionary (the sliding window) include a specific character (the hash key). Accordingly, the compression accelerator can obtain the position (the matched offset) of that specific character in the dictionary (the sliding window) for a longest match (LM) comparison. The so-called longest match comparison is to search for the longest length matchable in the dictionary (the sliding window) starting from the matched offset. Lastly, the compression accelerator can output a match pair (i.e., the matched length and the matched offset) to replace the raw data, so as to achieve the data compression.

However, if a large number of consecutive repeating characters appear in the content of the string to be compressed, it is obvious that these consecutive repeating characters (the same hash keys) are certainly corresponding to the same hash value. The same hash values entered the same hash bank will force a hardware compression accelerator (which is originally capable of handling multiple hash keys in parallel) to process only in a serial manner. Consequently, a data throughput may be reduced and a standard of software compression may even be lowered.

SUMMARY OF THE INVENTION

The invention provides an accelerated compression method and an accelerated compression apparatus for solving an issue of a hash conflict caused by substrings with the same content being sent to a hash matcher, so as to improve compression efficiency of the hardware compression accelerator.

An embodiment of the invention provides an accelerated compression method configured to be implemented in an accelerated compression apparatus. The accelerated compression apparatus includes a look-ahead buffer and a string matching processing pipeline. The accelerated compression method includes: extracting a string to be compressed from a data register and storing the string to be compressed to the look-ahead buffer, wherein the string to be compressed comprises Q characters; and P instances are issued in parallel from the look-ahead buffer in each of issue cycles, wherein each of the P instances sequentially corresponds to a substring using each character of consecutive P characters in the string to be compressed as a start character. Q and P are positive integers greater than 1, and Q is greater than P. When the P substrings corresponding to the P instances issued in a first issue cycle are identical to each other, a first instance and a second instance of the P instances are sent to the string matching processing pipeline for a matching operation and the remaining instances of the P instances are not sent to the string matching processing pipeline. In consecutive issue cycles after the first issue cycle, none of the P instances is sent to the string matching processing pipeline until the P substrings corresponding to the P instances are not identical to each other.

An embodiment of the invention provides an accelerated compression apparatus. The accelerated compression apparatus includes a look-ahead buffer, a string matching processing pipeline and a control circuit. The look-ahead buffer is configured to store a string to be compressed extracted from a data register, wherein the string to be compressed comprises Q characters, and P instances are issued in parallel from the look-ahead buffer in each of issue cycles. Each of the P instances sequentially corresponds to a substring using each character of consecutive P characters in the string to be compressed as a start character. Q and P are positive integers greater than 1, and Q is greater than P. The string matching processing pipeline is coupled to the look-ahead buffer. When the P substrings corresponding to the P instances issued in a first issue cycle are identical to each other, the control circuit sends a first instance and a second instance of the P instances to the string matching processing pipeline for a matching operation and does not send the remaining instances of the P instances to the string matching processing pipeline. In consecutive issue cycles after the first issue cycle, the control circuit does not send any of the P instances to the string matching processing pipeline until the P substrings corresponding to the P instances are not identical to each other.

Based on the above, the accelerated compression method and the accelerated compression apparatus in the embodiments of the invention can determine whether multiple substrings associated with multiple instances are identical to each other. When the substrings associated with the instances in the first issue cycle are identical to each other, each of two instances among the instances is sent to the string matching processing pipeline for the matching operation, and the remaining instances among the instances are not sent to the string matching processing pipeline. In the consecutive issue cycles after the first issue cycle, the control circuit does not send any hash request for each of the instances until the substrings corresponding to the instances are not identical to each other. As a result, the accelerated compression method and the accelerated compression apparatus can solve the issue of the hash conflict caused by the substrings with the same content being sent to the hash matcher. In this way, the accelerated compression method and the accelerated compression apparatus can improve compression efficiency of the hardware compression accelerator.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
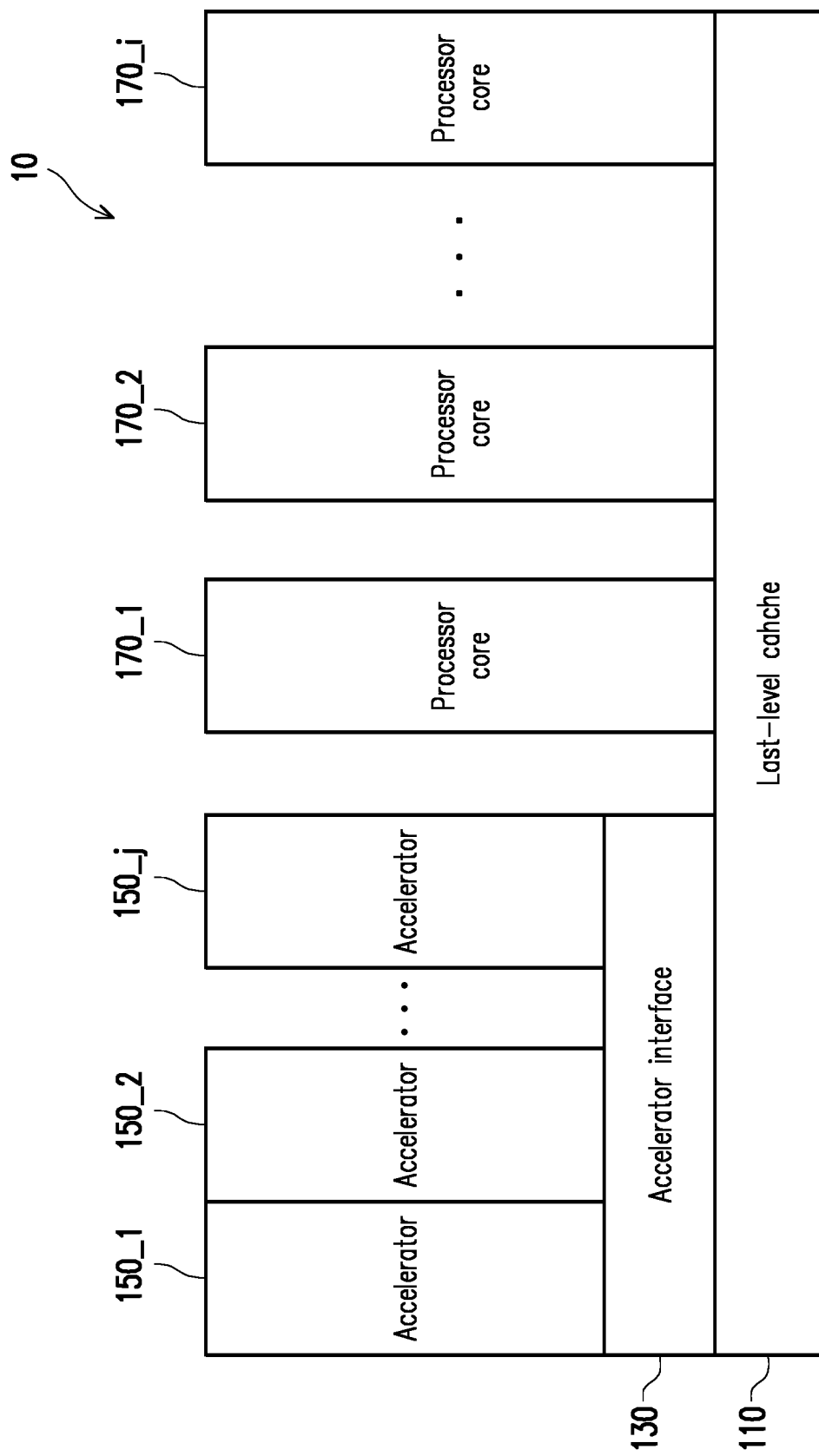
FIG. 1 is a schematic system diagram of a microprocessor according to an embodiment of the invention.

Reference will now be made in detail to the preferred embodiments of the invention, examples of which are illustrated in the accompanying drawings. Wherever possible, the same reference numbers are used in the drawings and the description to refer to the same or like parts.

The term "coupled (or connected)" used in this specification (including claims) may refer to any direct or indirect connection means. For example, "a first device is coupled (connected) to a second device" should be interpreted as "the first device is directly connected to the second device" or "the first device is indirectly connected to the second device through other devices or connection means". Moreover, elements/components/steps with same reference numerals represent same or similar parts in the drawings and embodiments.

Elements/components/steps with the same reference numerals or names in different embodiments may be cross-referenced.

FIG. 1 is a schematic system diagram of a microprocessor 10 according to an embodiment of the invention. The microprocessor 10 may include a plurality of processor cores, such as processor cores 170_1, 170_2, . . . , and 170_$i$ shown in FIG. 1. The microprocessor 10 further includes a plurality of accelerators, such as accelerators 150_1, 150_2, . . . , and 150_$j$ shown in FIG. 1. Here, i and j are integers, which vary with different design requirements. For instance, the accelerators 150_1 to 150_$j$ may be accelerator functional units (AFU). Any device included in the processor cores 170_1 to 170_$i$ is involved in the execution of computer instructions, and includes an arithmetic logic unit (ALU), a floating point unit (FPU), a L1 cache and a L2 cache. Each processor core adopts an instruction cycle (a.k.a. an extract-decode-execute cycle) as a basic operation flow. Such flow is used to allow the processor cores to obtain a program instruction, determine what operations this program instruction intends to perform, and perform these operations.

The accelerators 150_1 to 150_$i$ can execute different functions and can be connected to a last-level cache 110 via an accelerator interface 130. The accelerators 150_1 to 150_$i$ can exchange data with the processor cores 170_1 to 170_$i$ via the last-level cache 110 using a virtual address. Any one of the accelerators 150_1 to 150_$i$ can assist the processor cores 170_1 to 170_$i$ to perform specific functions in a more efficient manner, so as to mitigate the workload for the processor cores 170_1 to 170_$i$. The specific functions include compression, encryption, decryption, regular matching, and/or other functions with a large amount of computation. One of the accelerators 150_1 to 150_$j$ may be a compression accelerator configured to complete functions in a string compression.

Figure 2:
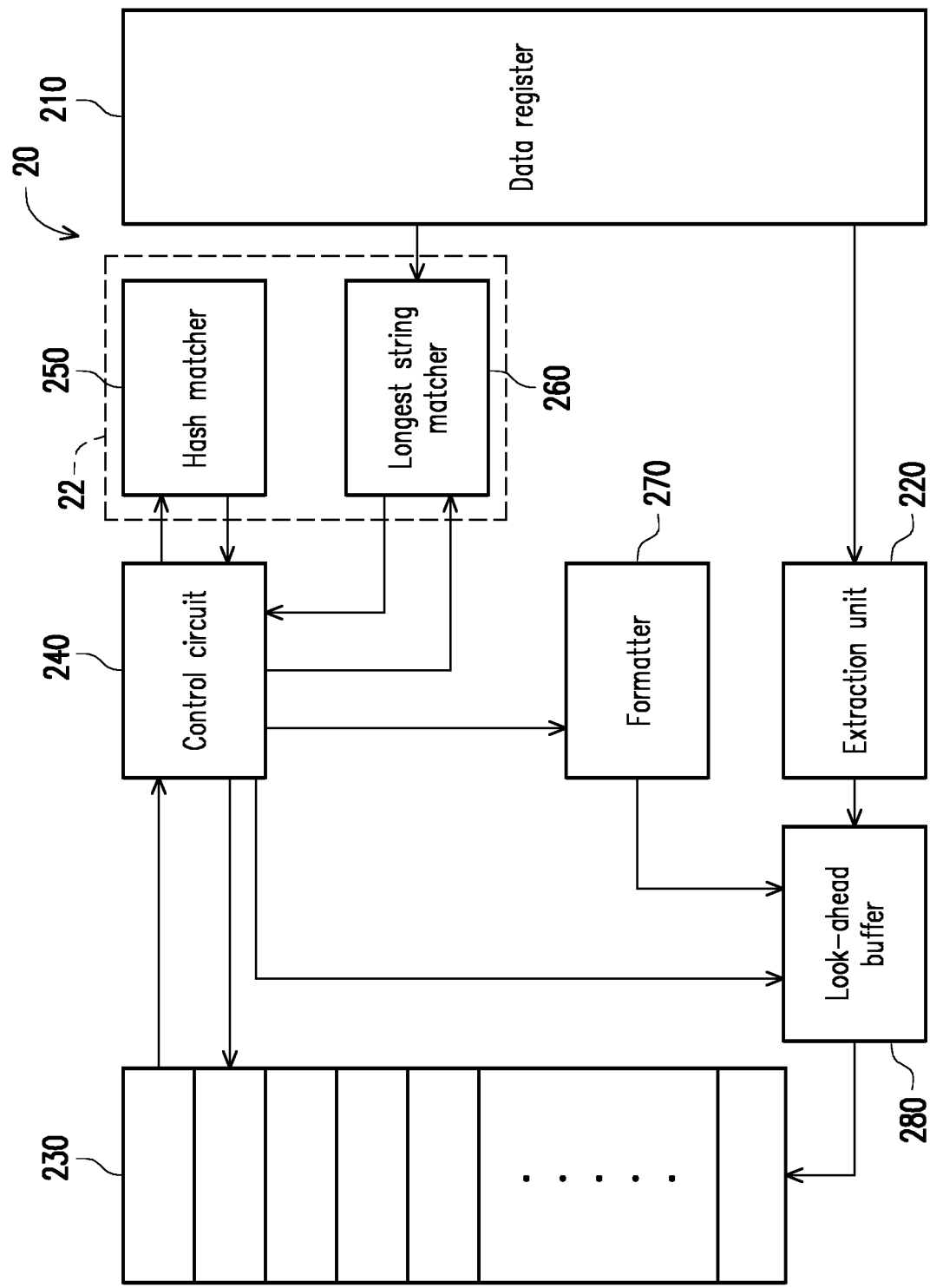
FIG. 2 is a circuit block diagram illustrating an accelerated compression apparatus according to an embodiment of the invention.

FIG. 2 is a circuit block diagram illustrating an accelerated compression apparatus 20 according to an embodiment of the invention. When one of the accelerators 150_1 to 150_$j$ shown in FIG. 1 is implemented as the compression accelerator, details of such compression accelerator can refer to the related description of the acceleration compression apparatus 20 shown in FIG. 2. With reference to FIG. 2, the accelerated compression apparatus 20 includes a look-ahead buffer 280 and a string matching processing pipeline 22. Based on design requirements, in an embodiment, a control circuit 240 may be further included to control a string matching operation (which will be described later in detail) performed on a character string issued from the look-ahead buffer 280 to the string matching processing pipeline 22. In an embodiment, the string matching processing pipeline 22 further includes a hash matcher 250 and a longest string matcher 260. However, the invention is not limited by the hash-based string matching method, and the technical solution described later in the invention is also applicable to the string matching processing pipeline 22 that adopts other matching techniques. In an embodiment, the accelerated compression apparatus 20 further includes a formatter 270, which compresses a string to be compressed by a particular compression algorithm based on a match result output by the string matching processing pipeline 22.

In another embodiment, the accelerated compression apparatus 20 further includes a data register 210. Based on design requirements, a length of the data register 210 may be 1024 M bytes or other lengths. The data register 210 is configured to store a raw string (i.e., the string to be compressed) and a compressed string. It should be noted that, in other embodiments, the data register 210 may be located in a last-level cache (e.g., the last-level cache 110 shown in FIG. 1), that is, located outside the accelerated compression apparatus 20.

In another embodiment, the accelerated compression apparatus 20 may further include an extraction unit 220 and the control circuit 240. A look-ahead request may be sent to the data register 210 through the extraction unit 220, so as to extract the string to be compressed with a length fixed to Q (e.g., Q is 16 bytes) from the data register 210. The extraction unit 220 can store the string to be compressed to the look-ahead buffer 280 as a target to be sent to the string matching processing pipeline 22 for the string compression. Further, the control circuit 240 further controls P instances issued in parallel from the look-ahead buffer 280 in each issue cycle. Here, each of the P instances sequentially corresponds to a substring using each character of consecutive P characters in the string to be compressed as a start character. Q and P are positive integers greater than 1, and Q is greater than P. In an embodiment, P may be 4 and each substring includes 3 characters, but the invention is not limited thereto.

In another embodiment, the accelerated compression apparatus 20 further includes an intermediary buffer 230. In an embodiment, once being issued, the instances are sequentially stored in the intermediary buffer 230. The intermediary buffer 230 stores related computing information associated with each substring (e.g., a hash, a longest string matching and/or other computing information). In detail, the intermediary buffer 230 divides a plurality of memory spaces, and each of which can be used to store information of one instance. Each instance includes multiple fields, and these fields are used to record an index, the start character, a state, a matched offset, a matched length of the corresponding substring and/or other computing information.

Since the accelerated compression apparatus 20 includes many parallel operations, a computing time (or the number of clock cycles) corresponding to each instance cannot be predicted. In other words, a computing result corresponding to the instance being issued later may be obtained earlier than a computing result corresponding to the instance issued earlier. The intermediary buffer 230 can match an output sequence of the computing results of all the instances with an original sequence of original characters to be compressed to thereby complete the longest string matching in the end. Both the look-ahead buffer 280 and the intermediary buffer 230 include an issuance pointer and a retirement pointer. The issuance pointer of the look-ahead buffer 280 sequentially points to the next instance to be issued in the look-ahead buffer 280 according to an original sequence of the substrings in the string to be compressed. Because the P instances are issued in parallel in each issue cycle, the issuance pointer will sequentially jump backwards over P characters in each of the issue cycles. The retirement pointer of the look-ahead buffer 280 sequentially points to the next instance to be retired in the look-ahead buffer 280 according to the original sequence to the substrings in the string to be compressed. That is to say, the retirement pointer can control the substrings of each instance to be retired according to the original sequence in the string to be compressed. Because the P instances that complete a matching operation are retired in parallel in each issue cycle, the retirement pointer will sequentially jump backwards over P characters in each of the issue cycles. It should be noted that, the issuance/retirement pointer of the intermediary buffer 230 may be synchronized with the issuance/retirement pointer of the look-ahead buffer 280. In an embodiment, if the size of the look-ahead buffer 280 is, for example, 512 bytes to at most store 512 characters, its issue/retract pointer has the length of 9 bits; if the intermediary buffer 280 includes, for example, a 64-layer entry to store at most 64 instances starting from the start character, its issue/retract pointer are lower 6 bits of the issue/retract pointer of the look-ahead buffer 280.

Initially, the extraction unit 220 extracts a plurality of original characters (the string to be compressed) from the data register 210. The extraction unit 220 extracts a plurality of substrings from the string to be compressed, and issues the substrings in parallel in form of the instance. In an embodiment, once being issued, the instances corresponding to the substrings are sequentially written into the intermediary buffer 230. In another embodiment, the instances corresponding to the substrings are sequentially written into corresponding spaces of the intermediary buffer 230 according to the original sequence in the string to be compressed only after the match result is generated. It should be noted that, the so-called "issued" refers to: when the issuance pointer of the look-ahead buffer 280 points to a particular character in the look-ahead buffer 280, the substring with that particular character as the start character (the instance) is then being "issued". After the P substrings (instances) are issued in parallel, P is added to the issuance pointer. For example, if the issuance pointer currently points to B3, after processing Hash Key 1: {B5, B4, B3}, Hash Key 2: {B6, B5, B4}, Hash Key 3: {B7, B6, B5}, and Hash Key 4: {B8, B7, B6}, the issuance pointer will jump to a position of B7.

Based on design requirements, the control circuit 240 may include a finite-state machine (FSM) and/or other control circuits/devices. For example, in some embodiments, control operations of the control circuit 240 described in this embodiment may be implemented in a programmable logic device (PLD), a programmable logic controller (PLC), a field programmable gate array (FPGA) or an application-specific integrated circuit (ASIC).

In an embodiment, the control circuit 240 can send a hash request for one instance to the hash matcher 250, so as to obtain information regarding whether the substring corresponding to said one instance and having a length being n can match one hash key in a hash table. In some embodiments, based on design requirements, n is 3 or more. The control circuit 240 can also send a data request for one instance to the longest string matcher 260, so as to obtain the substring corresponding to said one instance that can match a length of the raw string in the sliding window (the dictionary) of the data register 210. It should be noted that, the raw string in the sliding window is arranged before the raw string to be compressed in the look-ahead buffer 280, i.e., the raw string in the sliding window is the compressed string.

Figure 3:
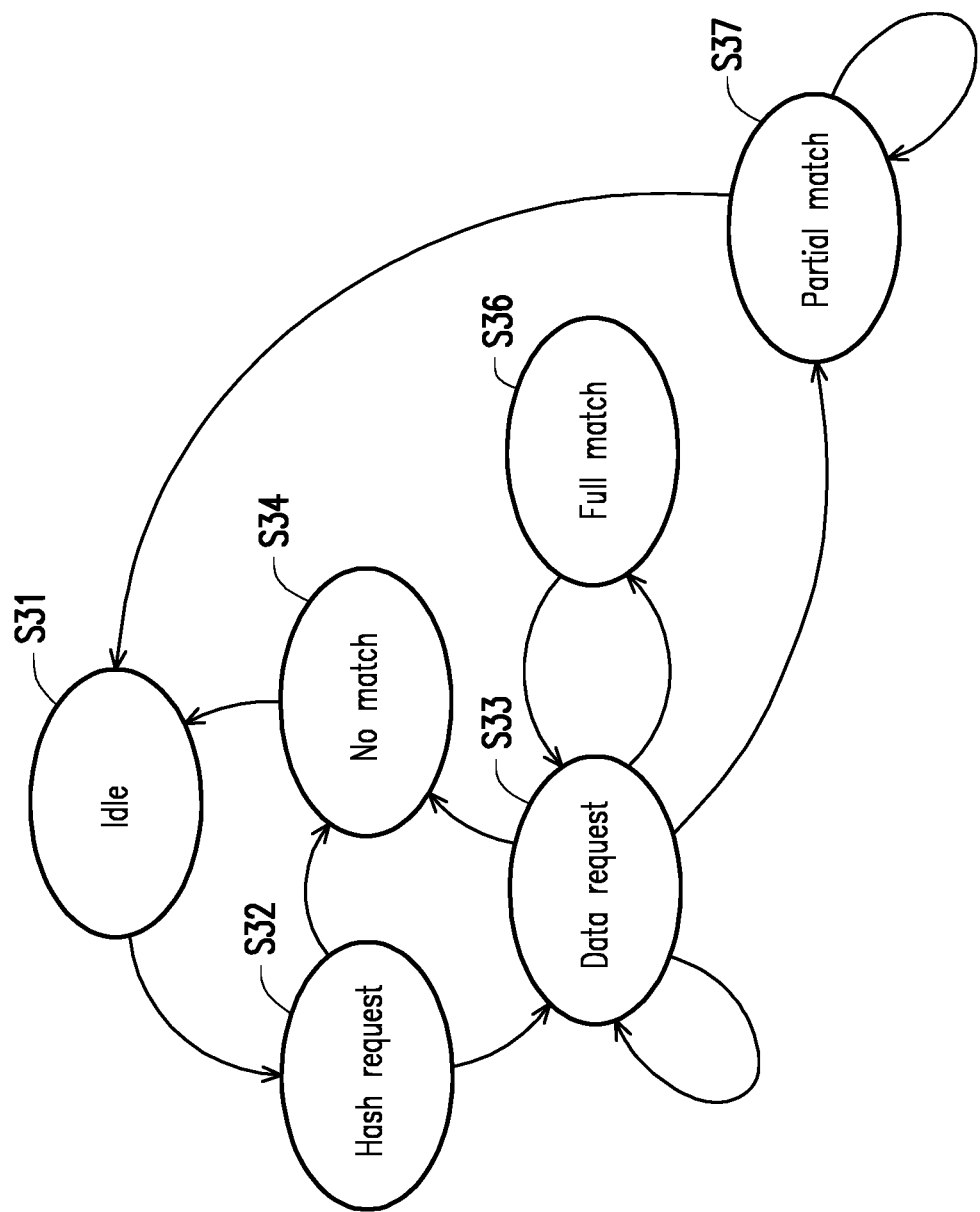
FIG. 3 illustrates a state diagram according to an embodiment of the invention.

FIG. 3 illustrates a state diagram according to an embodiment of the invention. Initially, the extraction unit 220 extracts the string to be compressed with a fixed length from the raw string of the data register 210 and stores the string to be compressed to the look-ahead buffer 280. Here, the string to be compressed includes Q characters. In an embodiment, Q is equal to 16. In an embodiment, after being issued or after the match result is generated, the instances corresponding to the substrings in the string to be compressed are sequentially stored to the intermediary register 230. For instance, the extraction unit 220 may extract a string to be compressed "abcdxyzefgafabc . . . " from the data register 210, and sequentially store the instances corresponding to the substrings being issued (or after the match result is generated) to the intermediary register 230. Table 1 shows initial results of the instances. Initially, the state of each instance is an idle state S31, as shown by Table 1. "/" shown in a state field of Table 1 indicates a null value.

TABLE 1

| Index | Substring | State | Matched length | Matched offset |
|-------|-----------|-------|----------------|----------------|
| 0 | abc | / | | |
| 1 | bcd | / | | |
| 2 | cdx | / | | |
| 3 | dxy | / | | |
| 4 | xyz | / | | |
| 5 | yze | / | | |
| 6 | zef | / | | |
| 7 | efg | / | | |
| 8 | fga | / | | |
| 9 | gaf | / | | |
| 10 | afa | / | | |
| 11 | fab | / | | |

In an embodiment, the control circuit 240 controls each instance in the string matching processing pipeline 22 so the matching operation can be performed thereto. The control circuit 240 may be implemented by a logic circuit, which controls the hash matcher 250 and the longest string matcher 260 to perform processes of the string matching operation in FIG. 4 to FIG. 7 described below, but the invention is not limited thereto.

Figure 4:
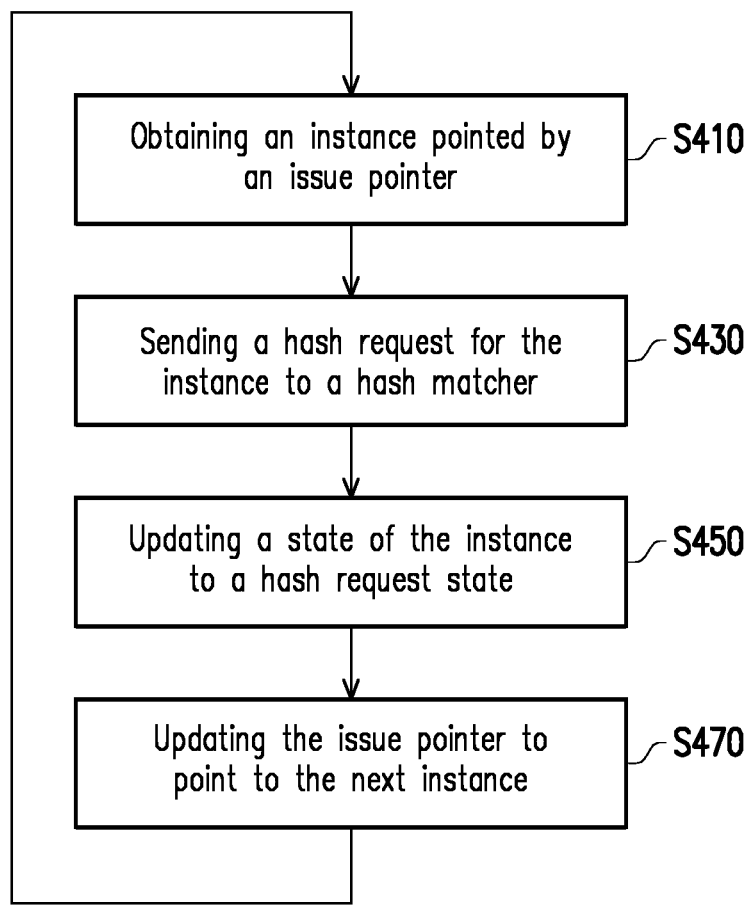
FIG. 4 is a flowchart illustrating a hash request operation according to an embodiment of the invention.

FIG. 4 is a flowchart illustrating a hash request operation according to an embodiment of the invention. In each clock cycle (issue cycle), the control circuit 240 obtains an instance pointed by the issuance pointer (step S410), sends a hash request for the instance to the hash matcher 250 (step S430), updates the state of the instance to "HASH_ISSUED" which indicates that the instance enters a hash request state S32 (step S450), and updates the issuance pointer to point to the next instance (step S470). The hash request contains characters of consecutive instances starting from said instance and having the length of n. For example, referring to Table 1, the hash request corresponding to an instance 0 contains a substring "abc", the hash request corresponding to an instance 1 contains a substring "bcd", and so on and so forth. The substrings "abc" and "bcd" are substrings of a string "abcdxyzefgaf", and characters "a" and "b" are respectively start characters of the substrings "abc" and "bcd".

Figure 5:
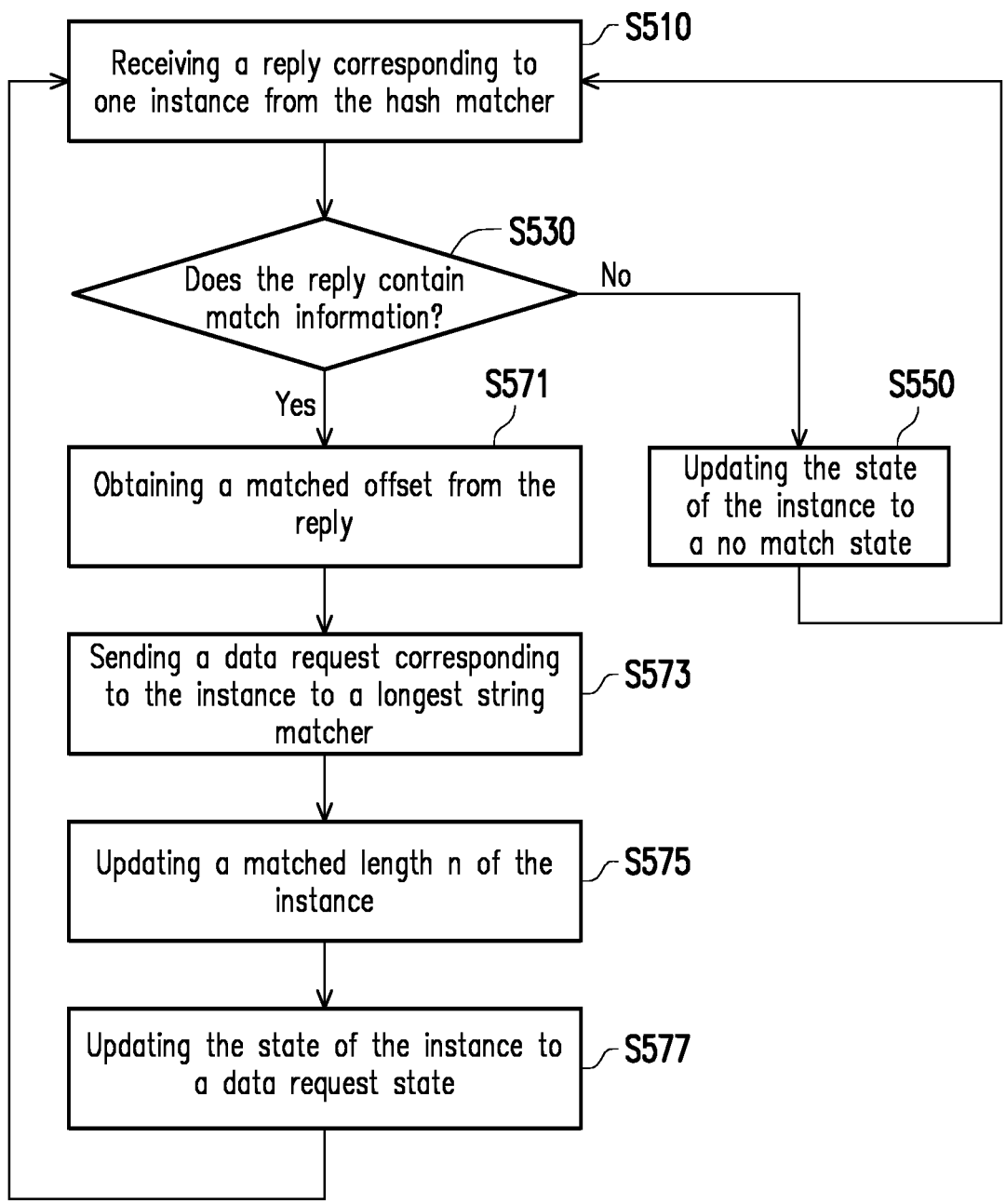
FIG. 5 is a flowchart illustrating a hash reply processing operation according to an embodiment of the invention.

FIG. 5 is a flowchart illustrating a hash reply processing operation according to an embodiment of the invention. After the control circuit 240 receives a reply corresponding to one instance from the hash matcher 250 (step S510), the control circuit 240 can determine whether the reply contains match information (step S530). In an embodiment, when the reply contains "no match" information (path of "No" in step S530), the control circuit 240 can update the state of the instance to "NM" which indicates that the instance enters a no match state S34 (step S550). The reply received from the hash matcher 250 contains the substring of the previous request, which allows the control circuit 240 to recognize which instance the reply corresponds to. When one instance enters the no match state S34, the control circuit 240 can reclaim the memory space of that instance for future instances in future clock cycles.

When the reply contains the "match" information (path of "Yes" in step S530), the control circuit 240 can obtain a matched offset from the reply (step S571), and send a data request corresponding to the instance to the longest string matcher 260 (step S573). Here, the data request contains aforementioned matched offset. In an embodiment, the longest string matcher 260 can search for a maximum matched length between a string starting from the substring corresponding to the instance in the look-ahead buffer 280 and a string starting from the matched offset in the sliding window (the dictionary) in the data register 210 in step S573. The control circuit 240 can update a matched length of the instance to n (step S575), and update the state of the instance to "DATA ISSUED" which indicates that the instance enters a data request state S33 (step S577). It should be noted that, in other embodiments, after obtaining the matched offset from the reply (step S571), the control circuit 240 may directly send the data request corresponding to the instance to the longest string matcher 260 without updating the content of the instance in the intermediary buffer 230 (i.e., without performing step S575 and step S577).

For instance, Table 2 shows updated results of the instances. After two clock cycles (issue cycles), the control circuit 240 updates the content in each entry in the intermediary buffer 230 according to results in the replies from the hash matcher 250 and the longest string matcher 260, as shown in Table 2.

TABLE 2

| Index | Substring | State | Matched length | Matched offset |
|-------|-----------|-------|----------------|----------------|
| 0 | abc | NM | | |
| 1 | bcd | HASH_ISSUED | | |
| 2 | cdx | NM | | |
| 3 | dxy | NM | | |
| 4 | xyz | DATA_ISSUED | 3 | 1000 |
| 5 | yze | NM | | |
| 6 | zef | NM | | |
| 7 | efg | / | | |
| 8 | fga | / | | |
| 9 | gaf | / | | |
| 10 | afa | / | | |
| 11 | fab | / | | |

Table 2 shows that the hash requests corresponding to the instances 0 to 6 have been sent to the hash matcher 250. The control circuit 240 has received the replies corresponding to the instance 0, the instance 2, the instance 3, the instance 5, and the instance 6 including the "no match" information (i.e., all being "NM" (No Match)) from the hash matcher 250. That is to say, the substrings "abc", "cdx", "dxy", "yze" and "zef" corresponding to the instance 0, the instance 2, the instance 3, the instance 5, and the instance 6 all have "no match" in the hash matcher 250, i.e., have not appeared in the raw string in the sliding window (the dictionary) of the data register 210. The control circuit 240 has received the reply corresponding to the instance 4 (which contains the "match" information) from the hash matcher 250 and has sent the data request to the longest string matcher 260 (but has not received any reply yet). The substring "xyz" corresponding to the instance 4 is determined as "match" by the hash matcher 250, i.e., the substring "xyz" has appeared in the raw string in the sliding window of the data register 210. The control circuit 240 obtains the matched offset of the substring "xyz" corresponding to the instance 4 in the sliding window from the reply of the hash matcher 250. Based on the reply from the hash matcher 250, the control circuit 240 can send the data request containing the matched offset to the longest string matcher 260, so as to search for the maximum matched length between the string starting from the substring "xyz" corresponding to the instance 4 in the look-ahead buffer 280 and the string starting from the matched offset (1000) in the sliding window (the dictionary) in the data register 210. In addition, the control circuit 240 has not yet received any reply corresponding to the instance 1 from the hash matcher 250.

Figure 6:
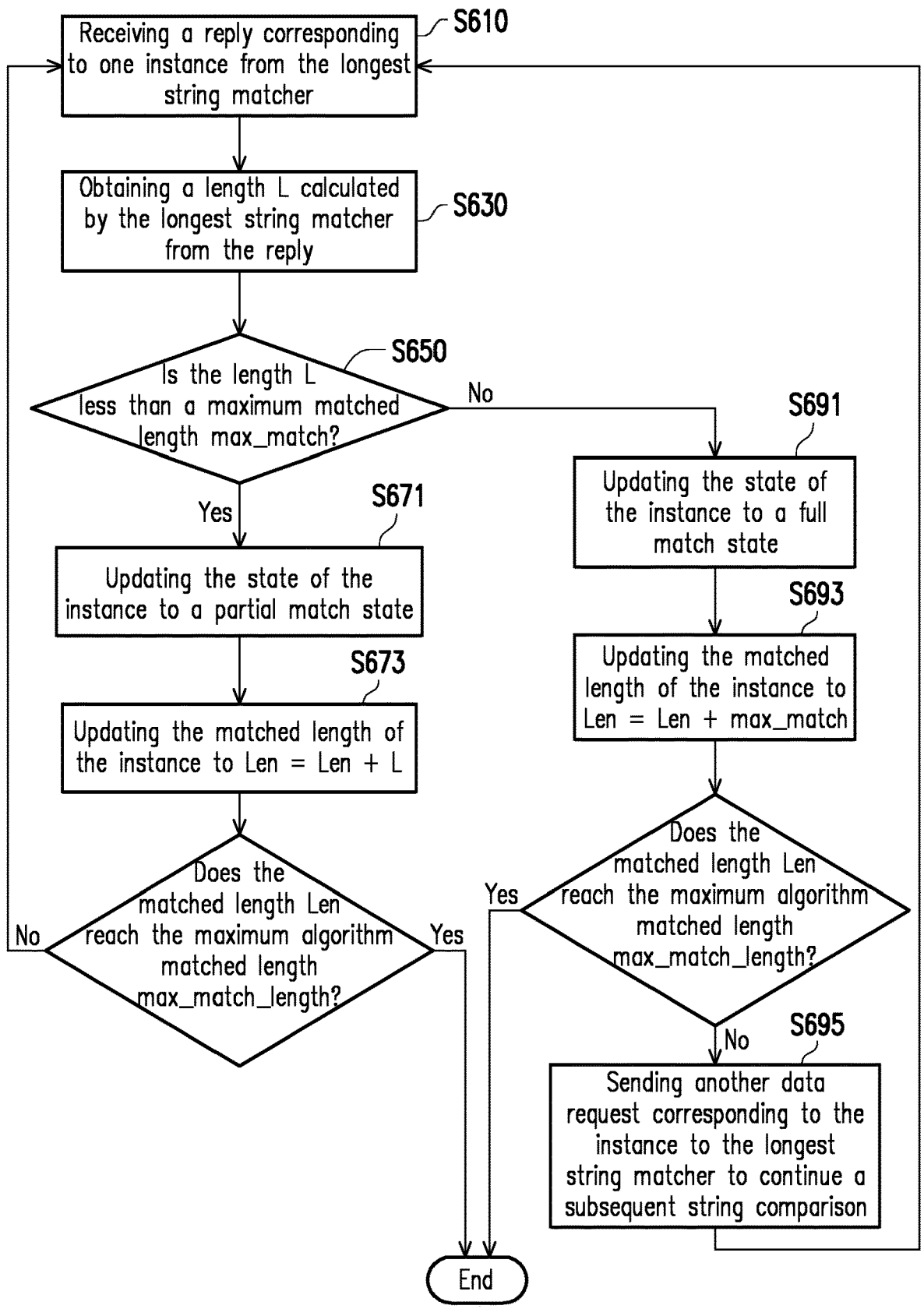
FIG. 6 is a flowchart illustrating a data reply processing operation according to an embodiment of the invention.

FIG. 6 is a flowchart illustrating a data reply processing operation according to an embodiment of the invention. After the control circuit 240 receives a reply corresponding to one instance from the longest string matcher 260 (step S610), the control circuit 240 can obtain a length L calculated by the longest string matcher 260 from the reply (step S630), determine whether the length L is less than a maximum matched offset max_match (step S650), and update a state, a matched length and a matched offset of the instance according to the determination result. Specifically, in an embodiment, when the length L is less than a maximum matched length max_match (path of "Yes" in step S650), the control circuit 240 can update the state of the instance to "PM" which indicates that the instance enters a partial match state S37 (step S671), and update the matched length of the instance to Len=Len+L (step S673). When one instance enters the partial match state S37, the control circuit 240 can reclaim the memory space of that instance for future instances in future clock cycles; when the length L is not less than (which is usually equal to) the maximum matched length max_match (path of "No" in step S650), the control circuit 240 can update the state of the instance to "FM" which indicates that the instance enters a full match state (step S691), update the matched length of the instance to Len=Len+max_match (step S693), and send another data request corresponding to the instance to the longest string matcher 260 to continue a subsequent string comparison (step S695). In an embodiment, the maximum matched length max_match is 16 bytes, and a maximum algorithm matched length max_match_length defined in the LZ77 series algorithm is 258 bytes. After step S673 and step S693, whether the matched length Len of the instance reaches the maximum algorithm matched length max_match_length will be determined. If so, the process of FIG. 11 ends. That is to say, the comparison does not go on without stopping, even if it is the full match. Instead, after the maximum algorithm matched length max_match_length is reached, the comparison stops. For example, in each comparison of 16 bytes, if the matched length 258 bytes has been reached, the comparison stops. It should be noted that, if step S575 of FIG. 5 for updating the content of the instance in the intermediary buffer 230 is not performed, the length n (e.g., n=3) of the substring corresponding to the instance needs to be further added to Len when updating the matched length in FIG. 6.

Figure 7:
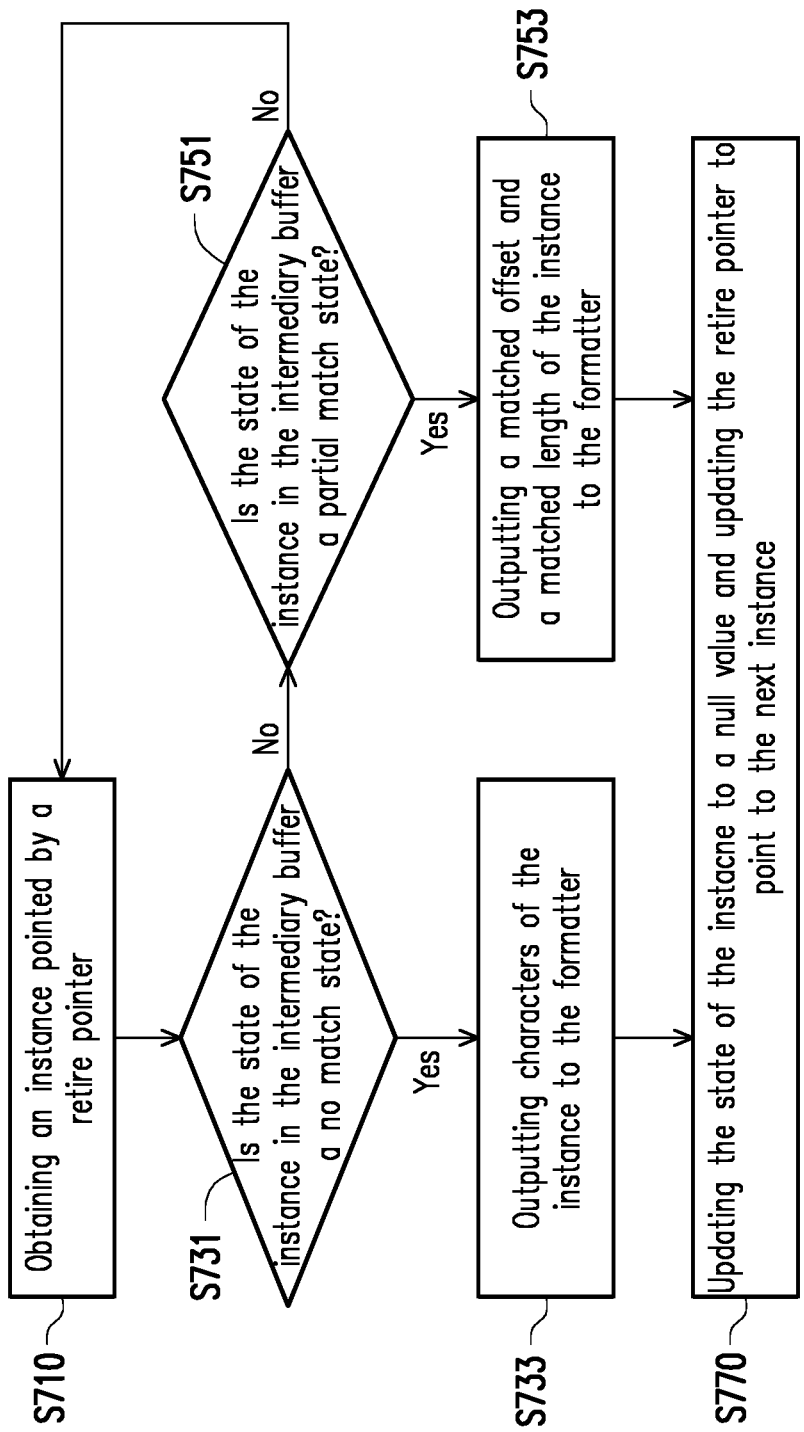
FIG. 7 is a flowchart illustrating a retirement processing operation according to an embodiment of the invention.

In one clock cycle, in addition to the hash request operation, the control circuit 240 further performs a retirement processing operation, so as to output the match result to the formatter 270 according to the original sequence of the substrings corresponding to all the issued instances in the string to be compressed and according to the state, the matched length and the matched offset of each of the instances so that the formatter 270 accordingly compresses the pre-fetched string to be compressed. FIG. 7 is a flowchart illustrating a retirement processing operation according to an embodiment of the invention. In each clock cycle, the control circuit 240 obtains an instance pointed by the retirement pointer (step S710), and determines whether the state of the instance in the intermediary buffer 230 is a no match state (step S731). When the state of the instance is the no match state (path of "Yes" in step S731), the control circuit 240 outputs the character of the instance to the formatter 270 (step S733), so that the formatter 270 can accordingly compress the string to be compressed in the look-ahead buffer 280.

When the state of the instance is not the "no match state" (path of "No" in step S731), the control circuit 240 can determine whether the state of the instance in the intermediary buffer 230 is a partial match state (step S751). When the state of the instance is the partial match state (path of "Yes" in step S751), the control circuit 240 outputs the matched offset and the matched length of the instance to the formatter 270 (step S753), so that the formatter 270 can accordingly compress the string to be compressed in the look-ahead buffer 280.

In step S733 or step S753, the formatter 270 can compress the string to be compressed by using conventional algorithms, including LZ4, LZO (Lempel-Ziv-Oberhumer), DEFLATE, etc. After step S733 or step S753 are completed, the control circuit 240 can update the state of the instance to the null value, and update the retirement pointer to point to the next instance in step S770 (for retiring the instance so that the memory space may be provided for future instances being pushed in).

When the state of the instance is "match" but not the partial match state (path of "No" in step S751), i.e., the full match state, as described by step S691 in FIG. 6, unless the matched length Len reaches the maximum algorithm matched length max_match_length, the control 240 will send another data request corresponding to the instance to the longest string matcher 260 to continue the subsequent string comparison without performing the retirement operation on the instance. Path of "No" in step S751 in FIG. 7 leads back to step S710 to continue waiting for changes in the state of the instance. In general, when performing the retirement processing operation in FIG. 7, the control circuit 240 outputs the match result to the formatter 270 according to the original sequence of the substrings associated with the instances in the string to be compressed (e.g., a sequence that the retirement pointer is according to) in the intermediary buffer 230 and according to the state, the matched length and the matched offset of each of the instances (e.g., as shown by Table 3 to Table 5 below) in the intermediary buffer 230, so that the formatter 270 accordingly compresses the raw string to be compressed. Details regarding the above will be described below with reference to Table 3 to Table 5.

Following the example of Table 2, it is assumed that in a clock cycle T7, the issuance pointer points to the instance 7, the retirement pointer points to the instance 0, the maximum match length max_match is preset to 258 bytes, and the control circuit 240 receives the reply corresponding to the instance 4 from the longest string matcher 260. In the clock cycle T7, referring to FIG. 4, the control circuit 240 obtains the instance 7 pointed by the issuance pointer (step S410); the control circuit 240 sends the hash request containing the substring "efg" for the instance 7 to the hash matcher 250 (step S430); the control circuit 240 updates the state of the instance 7 to "HASH_ISSUED" which indicates that the instance 7 enters the hash request state S32 (step S450); and the control circuit 240 updates the issuance pointer to point to the instance 8 (step S470). In the clock cycle T7, referring to FIG. 7, the control circuit 240 obtains the state of the instance 0 pointed by the retirement pointer (step S710). Because the state of the instance 0 is the no match state, the control circuit 240 outputs the character "a" of the instance 0 to the formatter 270 (step S733) so the formatter 270 can keep the character "a" without performing compression actions. The control circuit 240 makes the sliding window in the data register 210 move forward by one character, i.e., makes the character "a" in the data register 210 slide into the sliding window as a part of the new dictionary. The control circuit 240 updates the state of the instance 0 to the null value "/", and updates the retirement pointer to point to the instance 1 (step S770). Referring to FIG. 6, in the clock cycle T7, the control circuit 240 obtains the length L=2 calculated by the longest string matcher 260 from the reply corresponding to the instance 4 (step S630). Because L<max_match, the control circuit 240 updates the state of the instance 4 to "PM" which indicates that the instance 4 enters the partial match state S37 (step S671); and the control circuit 240 updates the matched length of the instance 4 to Len=3+2=5 (step S673). The states of the instances in the intermediary buffer 230 are updated to Table 3.

TABLE 3

| Index | Substring | State | Matched length | Matched offset |
|---|---|---|---|---|
| 0 | | / | | |
| 1 | bcd | HASH_ISSUED | | |
| 2 | cdx | NM | | |
| 3 | dxy | NM | | |
| 4 | xyz | PM | 5 | 1000 |
| 5 | yze | NM | | |
| 6 | zef | NM | | |
| 7 | efg | HASH_ISSUED | | |
| 8 | fga | / | | |
| 9 | gaf | / | | |
| 10 | afa | / | | |
| 11 | fab | / | | |

Following the example of Table 3, it is assumed that in a clock cycle T8, the clock cycle 240 receives the reply corresponding to the instance 1 from the hash matcher 250. In the clock cycle T8, referring to FIG. 4, the control circuit 240 obtains the instance 8 pointed by the issuance pointer (step S410), sends the hash request containing the substring "fga" for the instance 8 to the hash matcher 250 (step S430), updates the state of the instance 8 to "HASH_ISSUED" which indicates that the instance 8 enters the hash request state S32 (step S450); and updates the issuance pointer to point to the instance 9 (step S470). Referring to FIG. 7, in the clock cycle T8, the control circuit 240 obtains the state of the instance 1 pointed by the retirement pointer (step S710). Because the state of the instance 1 is the hash request state, the control circuit 240 does not perform any processing. Referring to FIG. 5, in the clock cycle T8, the clock cycle 240 receives the reply corresponding to the instance 1 from the hash matcher 250 (step S510). Because the reply contains the "no match" information, the control circuit 240 updates the state of the instance 1 to "NM" which indicates that the instance 1 enters the no match state S34 (step S550). The states of the instances in the intermediary buffer 230 are updated to Table 4.

TABLE 4

| Index | Substring | State | Matched length | Matched offset |
|---|---|---|---|---|
| 0 | abc | / | | |
| 1 | bcd | NM | | |
| 2 | cdx | NM | | |
| 3 | dxy | NM | | |
| 4 | xyz | PM | 5 | 1000 |
| 5 | yze | NM | | |
| 6 | zef | NM | | |
| 7 | efg | HASH_ISSUED | | |
| 8 | fga | HASH_ISSUED | | |
| 9 | gaf | / | | |
| 10 | afa | / | | |
| 11 | fab | / | | |

Following the example of Table 4, it is assumed that in a clock cycle T9, the clock cycle 240 receives the reply corresponding to the instance 7 from the hash matcher 250. In the clock cycle T9, referring to FIG. 4, the control circuit 240 obtains the instance 9 pointed by the issuance pointer (step S410), sends the hash request containing the substring "gaf" for the instance 9 to the hash matcher 250 (step S430), updates the state of the instance 9 to "HASH_ISSUED" which indicates that the instance 9 enters the hash request state S32 (step S450); and updates the issuance pointer to point to the instance 10 (step S470). Referring to FIG. 7, in the clock cycle T9, the control circuit 240 obtains the state of the instance 1 pointed by the retirement pointer (step S710). Because the state of the instance 1 is the no match state, the control circuit 240 outputs the character "b" of the instance 1 to the formatter 270 so the formatter 270 can keep the character "b" without performing compression actions (step S733). The control circuit 240 makes the sliding window in the data register 210 move forward by one character, i.e., makes the character "b" in the data register 210 slide into the sliding window as a part of the new dictionary. The control circuit 240 updates the state of the instance 1 to the null value "/", and updates the retirement pointer to point to the instance 2 (step S770). Referring to FIG. 5, in the clock cycle T9, the clock cycle 240 receives the reply corresponding to the instance 7 from the hash matcher 250 (step S510). Because the reply contains the "no match" information, the control circuit 240 updates the state of the instance 7 to "NM" which indicates that the instance 7 enters the no match state S34 (step S550). The states of the instances in the intermediary buffer 230 are updated to Table 5.

TABLE 5

| Index | Substring | State | Matched length | Matched offset |
|---|---|---|---|---|
| 0 | abc | / | | |
| 1 | bcd | / | | |
| 2 | cdx | NM | | |
| 3 | dxy | NM | | |
| 4 | xyz | PM | 5 | 1000 |
| 5 | yze | NM | | |
| 6 | zef | NM | | |
| 7 | efg | NM | | |
| 8 | fga | HASH_ISSUED | | |
| 9 | gaf | HASH_ISSUED | | |
| 10 | afa | / | | |
| 11 | fab | / | | |

The following description refers to FIG. 7. After a period of time, for example, in a clock cycle T12, the control circuit 240 obtains the state of the instance 4 pointed by the retirement pointer (step S710). It should be noted that before this step, because the characters "c" and "d" in the string to be compressed in the look-ahead buffer 280 have no match, the characters "c" and "d" are kept without the compression action performed, and the characters "c" and "d" in the data register 210 have already been slided into the sliding window as a part of the new dictionary. In the clock cycle T12, because the state of the instance 4 is the partial match state, the control circuit 240 outputs the matched offset (e.g., 1000) and the matched length (e.g., 5) of the instance 4 to the formatter 270 so the formatter 270 can accordingly compress the raw string to be compressed in the look-ahead buffer 280. Because the state of the instance 4 is the partial match state and the matched length is 5, the characters "xyzef" in the look-ahead buffer 280 is replaced by a match pair (1000, 5) and the sliding window in the data register 210 is moved forward by 5 characters (i.e., the characters "xyzef" in the data register 210 are slided into the sliding window as a part of the new dictionary).

It should be noted that, as shown in the above example, although the control circuit 240 sends the corresponding hash request to initiate the compression operation according to the sequence of the instances, each instance may not be able to enter the no matched state S34 or the partial match state S37 according to the original sequence since the computing times of the hash matcher 250 and the longest string matcher 260 cannot be predicted. Even though each instance may not be able to enter the no match state S34 or the partial match state S37 according to the original sequence, through the embodiments described above, the control circuit 240 can still output the computing results corresponding to the instances of the hash matcher 250 and the longest string matcher 260 to the formatter 270 according to the retirement pointer and according to the original sequence of the substrings corresponding to the instances in the string to be compressed in the look-ahead buffer 280.

Figure 8:
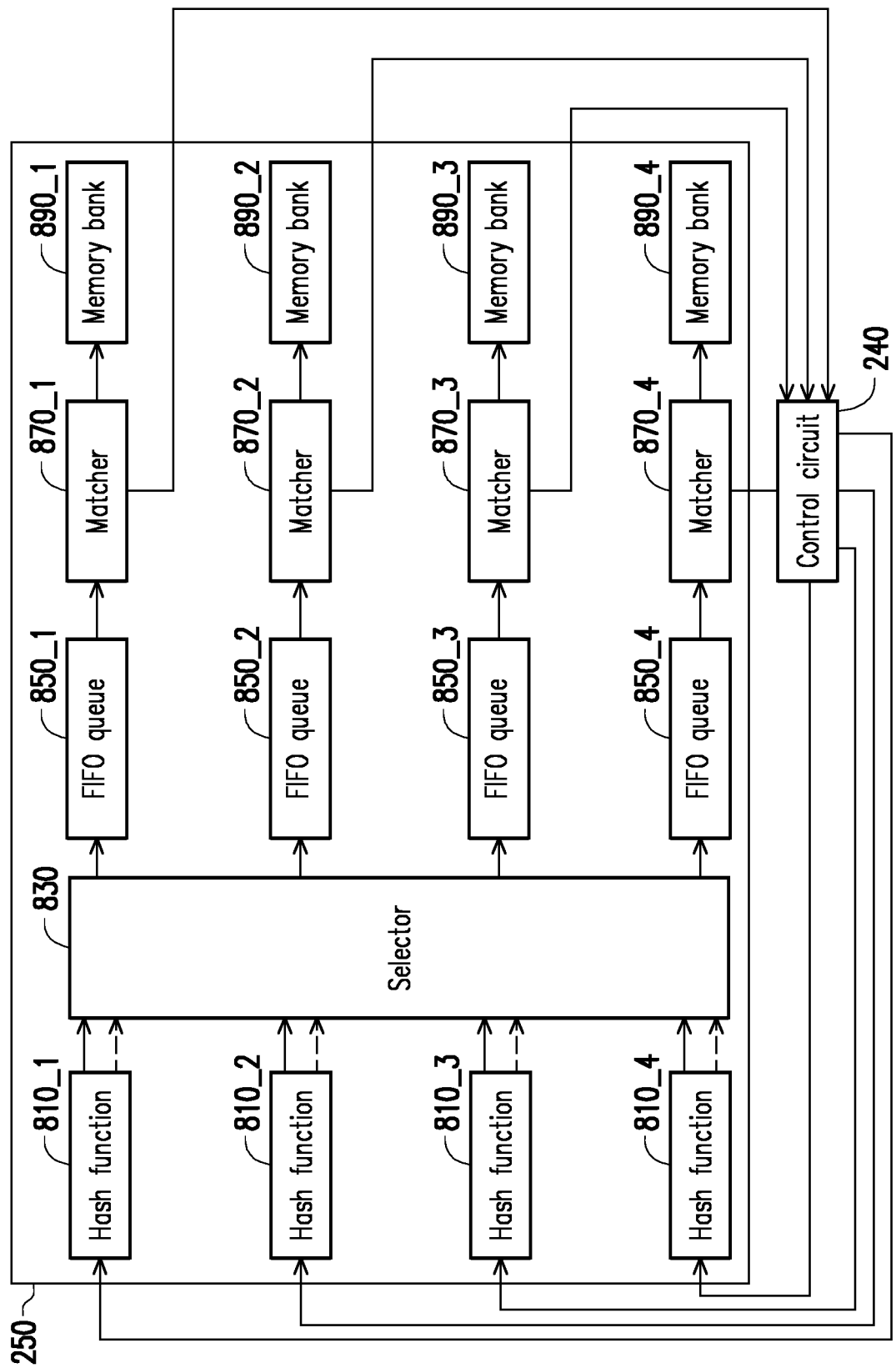
FIG. 8 is a circuit block diagram illustrating the hash matcher shown in FIG. 2 according to an embodiment of the invention.

FIG. 8 is a circuit block diagram illustrating the hash matcher 250 in the string matching processing pipeline 22 shown in FIG. 2 according to an embodiment of the invention. To accelerate a hash matching, the hash matcher 250 may include a plurality of matching paths for a parallel processing, and each of the paths includes a first in first out (FIFO) queue, a matcher and a memory bank. For example, a first matching path includes a FIFO queue 850_1, a matcher 870_1 and a memory bank 890_1; a second matching path includes a FIFO queue 850_2, a matcher 870_2 and a memory bank 890_2; a third matching path includes a FIFO queue 850_3, a matcher 870_3 and a memory bank 890_3; and a fourth matching path includes a FIFO queue 850_4, a matcher 870_4 and a memory bank 890_4. Any one of hash functions 810_1, 810_2, 810_3 and 810_4 can map the substring corresponding to one instance transmitted from the control circuit 240 to a hash index, and drive a selector 830 according to the hash index to connect to one corresponding matching path among the matching paths so the substring may be transmitted to the corresponding matching path. It should be noted that, the hash functions 810_1, 810_2, 810_3 and 810_4 execute the same hash calculation. When the corresponding matching path determines that the hash table does not include the substring, the corresponding matching path will transmit the "no match" information to the control circuit 240. If the hash table includes the substring, it means that the substring does exist in the sliding window in the data register 210. For example, if the hash table includes the substring "xyz" corresponding to the instance 4, it means that the substring "xyz" does exist in the sliding window in the data register 210. When the corresponding matching path determines that the hash table does include the substring, the corresponding matching path transmits the "match" information and the matched offset corresponding to the substring in the hash table to the control circuit 240.

Although the embodiment of the invention is described using four sets of matching paths as an example, based on design requirements, those skilled in the art can dispose more or fewer matching paths in the hash matcher 250, which are not particularly limited by the invention. The hash table is divided into four parts according to upper two bits of the hash index (i.e., a hash table address), and stored in the four memory banks 890_1 to 890_4, respectively. The memory banks 890_1 to 890_4 may be implemented by using cache memories. The hash table includes N entries. The memory bank 890_1 stores the 0th to ((N/4)−1)th entries; the memory bank 890_2 stores the (N/4)th to ((N/2)−1)th entries; the memory bank 890_3 stores the (N/2)th to ((3N/4)−1)th entries; and the memory bank 890_4 stores the (3N/4)th to (N−1)th entries. That is to say, the hash table is distributed according to upper two bits of the hash table address. In other implementations, the hash table may also be distributed according to lower two bits of the hash table address or other bits of the hash table address. In this embodiment, each entry can include information regarding a plurality of (e.g., three) hashed keys, and these three hash keys have the same hash index to form a hash chain. For instance, when n is 3 and data in each entry is stored by using 16 byes, the data structure is as shown by Table 6.

TABLE 6

| Address | Name | Description |
| --- | --- | --- |
| Byte[0] | Tag | A tag |
| Byte[1:3] | Hash_Key_1 | First hash key |
| Byte[4:5] | Hash_Offset_1 | First hash offset |
| Byte[6:8] | Hash_Key_2 | Second hash key |
| Byte[9:10] | Hash_Offset_2 | Second hash offset |
| Byte[11:13] | Hash_Key_3 | Third hash key |
| Byte[14:15] | Hash_Offset_3 | Third hash offset |

The 0th byte of each entry stores a tag "Tag", and uses three bits at fixed positions to indicate whether the three hash keys in the entry are valid, respectively. For example, the three bits "100" indicates that the first hash key is valid while the second and the third hash keys are invalid, the three bits "110" indicates that the first and the second hash keys are valid while the third hash key is invalid, and so on and so forth. The 1st to the 3rd bytes of each entry store a first hash key "Hash_Key_1" associated with one hashed index which indicates that the raw string in the sliding window includes the substring corresponding to the first hash key "Hash_Key_1". The 4th to the 5th bytes of each entry store a first hash offset "Hash_Offset_1" associated with the first hash key which represents an offset of the substring corresponding to the first hash key included in the raw string in the sliding window. The 6th to the 8th bytes of each entry store a second hash key "Hash_Key_2" associated with the same hashed index which indicates that the raw string in the sliding window includes the substring corresponding to the second hash key "Hash_Key_2". The 9th to the 10th bytes of each entry store a second hash offset "Hash_Offset_2" associated with the second hash key which represents an offset of the substring corresponding to the second hash key included in the raw string in the sliding window. The 11th to the 13th bytes of each entry store a third hash key "Hash_Key_3" associated with the same hashed index which indicates that the raw string in the sliding window includes the substring corresponding to the third hash key "Hash_Key_3". The 14th to the 15th bytes of each entry store a third hash offset "Hash_Offset_3" associated with the third hash key which represents an offset of the substring corresponding to the third hash key included in the raw string in the sliding window. Those skilled in the art can change the content of each entry based on design requirements to store more or fewer hash keys and the associated hash offsets, which are not particularly limited by the invention.

To accelerate the hash matching, the hash matcher 250 can include the four hash functions 810_1 to 810_4. The hash functions 810_1 to 810_4 perform the same algorithm to map any substring to a hash index with a fixed length. The length of the hash index is less than the length of the substring. The control circuit 240 can simultaneously output four hash requests to the hash functions 810_1 to 810_4 in a one-to-one manner in the same clock cycle (issue cycle) by a 4-issue method. That is to say, in each issue cycle, the issuance pointer of the look-ahead buffer 280 sequentially jumps backwards over four characters, and the control circuit 240 issues four substrings (instances) each using one of the characters as the start character in parallel from the look-ahead buffer 280 according to the issuance pointer. One of the hash functions 810_1 to 810_4 drives the selector 830 to connect itself to one of the FIFO queues 850_1 to 850_4 according to the mapped hash index, so as to push the hash request into the connected FIFO queue. For example, when the hash function 810_1 maps/converts the substring "abc" to a hash index "0", the hash function 810_1 can drive the selector 830 to connect the hash function 810_1 to the FIFO queue 850_1 so the hash function 810_1 can push the hash request into the FIFO queue 850_1. It should be noted that, the pushed hash request includes the string generated by the control circuit 240 and the hash index generated corresponding to the hash function.

The hash matcher 250 may include the four matchers 870_1 to 870_4 for the parallel processing. The matcher 870_1 is connected between the FIFO queue 850_1 and the memory bank 890_1. The matcher 870_2 is connected between the FIFO queue 850_2 and the memory bank 890_2. The matcher 870_3 is connected between the FIFO queue 850_3 and the memory bank 890_3. The matcher 870_4 is connected between the FIFO queue 850_4 and the memory bank 890_4. Any one of the matchers 870_1 to 870_4 can obtain the first hash request being entered from the connected FIFO queue, search for the entry matching the hash index in the hash request from the connected memory bank, and determine whether the valid hash key exists by checking the tag of the searched entry. When the valid hash key does not exist, the matcher determines that the entry matching the hash index in the hash request is not found, and replies to the control circuit 240 with the "no match" information for the string in the hash request. When the valid hash key does exist, the matcher further determines whether there is any valid hash key identical to the string in the hash request. When all the valid hash keys are different from the string in the hash request, the matcher replies to the control circuit 240 with the "no match" information for the string in the hash request. When there is one valid hash key identical to the string in the hash request, the matcher replies to the control circuit 240 with the "match" information for the string in the hash request and the hash offset associated with that hash key.

Figure 9:
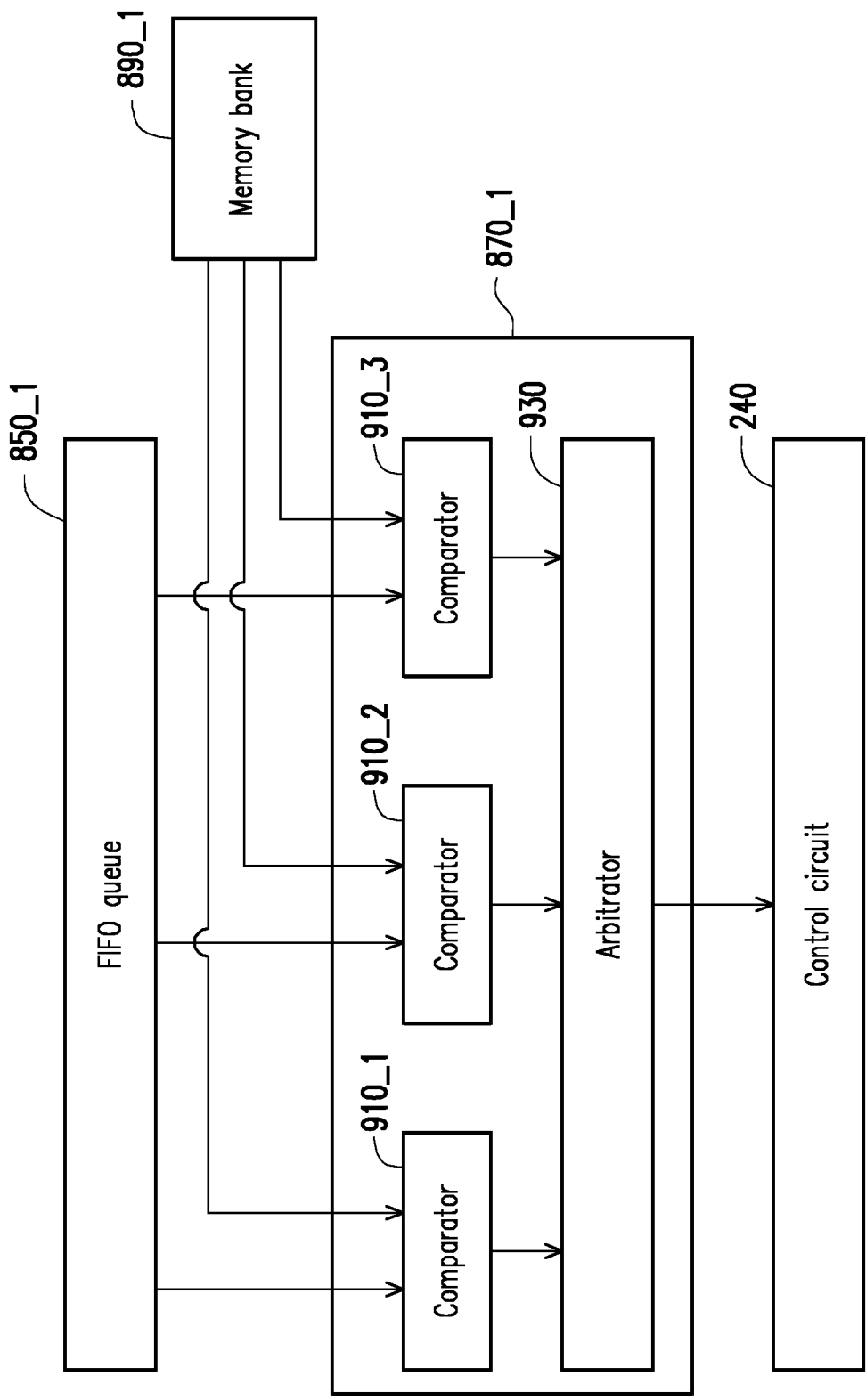
FIG. 9 is a circuit block diagram illustrating the matcher shown in FIG. 8 according to an embodiment of the invention.

FIG. 9 is a circuit block diagram illustrating the matcher 870_1 shown in FIG. 8 according to an embodiment of the invention. Although the embodiment shown in FIG. 9 is exemplified by the matcher 870_1, those skilled in the art can derive the implementation details of the matchers 870_2 to 870_4 shown in FIG. 8 according to the related description of FIG. 9. In the embodiment shown in FIG. 9, the matcher 870_1 includes a comparator 910_1, a comparator 910_2, a comparator 910_3 and an arbitrator 930. The comparator 910_1 obtains the string in the hash request from the FIFO queue 850_1 and obtains the first hash key and the first hash offset of the corresponding entry from the memory bank 890_1. The comparator 910_1 determines whether the string is identical to the first hash key. When the string is identical to the first hash key, the comparator 910_1 outputs the first hash offset to the arbitrator 930. The comparator 910_2 obtains the string in the hash request from the FIFO queue 850_1 and obtains the second hash key and the second hash offset of the corresponding entry from the memory bank 890_1. The comparator 910_2 determines whether the string is identical to the second hash key. When the string is identical to the second hash key, the comparator 910_2 outputs the second hash offset to the arbitrator 930. The comparator 910_3 obtains the string in the hash request from the FIFO queue 850_1 and obtains the third hash key and the third hash offset of the corresponding entry from the memory bank 890_1. The comparator 910_3 determines whether the string is identical to the third hash key. When the string is identical to the third hash key, the comparator 910_3 outputs the third hash offset to the arbitrator 930.

When the arbitrator 930 does not receive any hash offset from the comparators 910_1 to 910_3, the arbitrator 930 replies to the control circuit 240 with the "no match" information for the string in the hash request. When the arbitrator 930 receives one hash offset from the comparators 910_1 to 910_3, the arbitrator 930 replies to the control circuit 240 with the "match" information for the string in the hash request and the received hash offset. When the arbitrator 930 receives two or more hash offsets from the comparators 910_1 to 910_3, the arbitrator 930 replies to the control circuit 240 with the "matched" information for the string in the hash request and a smallest value of the received hash offsets.

For instance, for the substring "abc" in the hash request, when the hash index "0" is mapped (or calculated) by the hash function 810_1, the entry corresponding to the hash index "0" in the corresponding memory bank 890_1 includes three hash keys and their hash offsets, which are: the first hash key "abc" (the hash offset is 50), the second hash key "xyz" (the hash offset is 100), and the third hash key "abc" (the hash offset is 200). It should be noted that, although key values of the hash keys "abc" and "xyz" are different, however, it is possible that the hash indexes mapped (or calculated) by the hash function 810_1 are identical due to the operation rule of the hash function. For example, the hash indexes of the hash keys "abc" and "xyz" here are both "0". Further, the two identical hash keys "abc" indicate that the substring "abc" appears twice at different offset positions in the raw string in the sliding window, but their hash offsets are different. Because the first hash key "abc" and the third hash key "abc" are both identical to the string "abc" in the hash request, the comparator 910_1 and the comparator 910_3 will respectively output the first hash offset (50) and the third hash offset (200) to the arbitrator 930. At this time, the arbitrator 930 will reply to the control circuit 240 with the match information for the string "abc" and the smaller hash offset 50. It should be noted that in other embodiments, when each entry of the hash table in the memory bank has multiple matches as described above (i.e., the hash keys are "abc"), the arbitrator 930 will reply to the control circuit 240 with the match information for the string in the hash request, and pushes all the matched hash offsets to the control circuit 240.

In this embodiment, in each issue cycle, the issuance pointer of the look-ahead buffer 280 sequentially jumps backwards over P characters, and the control circuit 240 issues P substrings (instances) each using one of the characters as the start character in parallel from the look-ahead buffer 280 according to the issuance pointer. Further, the control circuit 240 can simultaneously output R hash requests to multiple hash functions in the same clock cycle for performing the hash matching in parallel. With the state, the matched length, and the matched offset of each instance recorded by the intermediary buffer of the embodiment, after the out-of-order execution of the hash matching and longest matching, the instances can still be retired for compression according to the original sequence in the string to be compressed. The following embodiments of FIGS. 11 to 13 will explain the relationship between P and R in detail when there are a large number of repeating characters in the string to be compressed.

Figure 10:
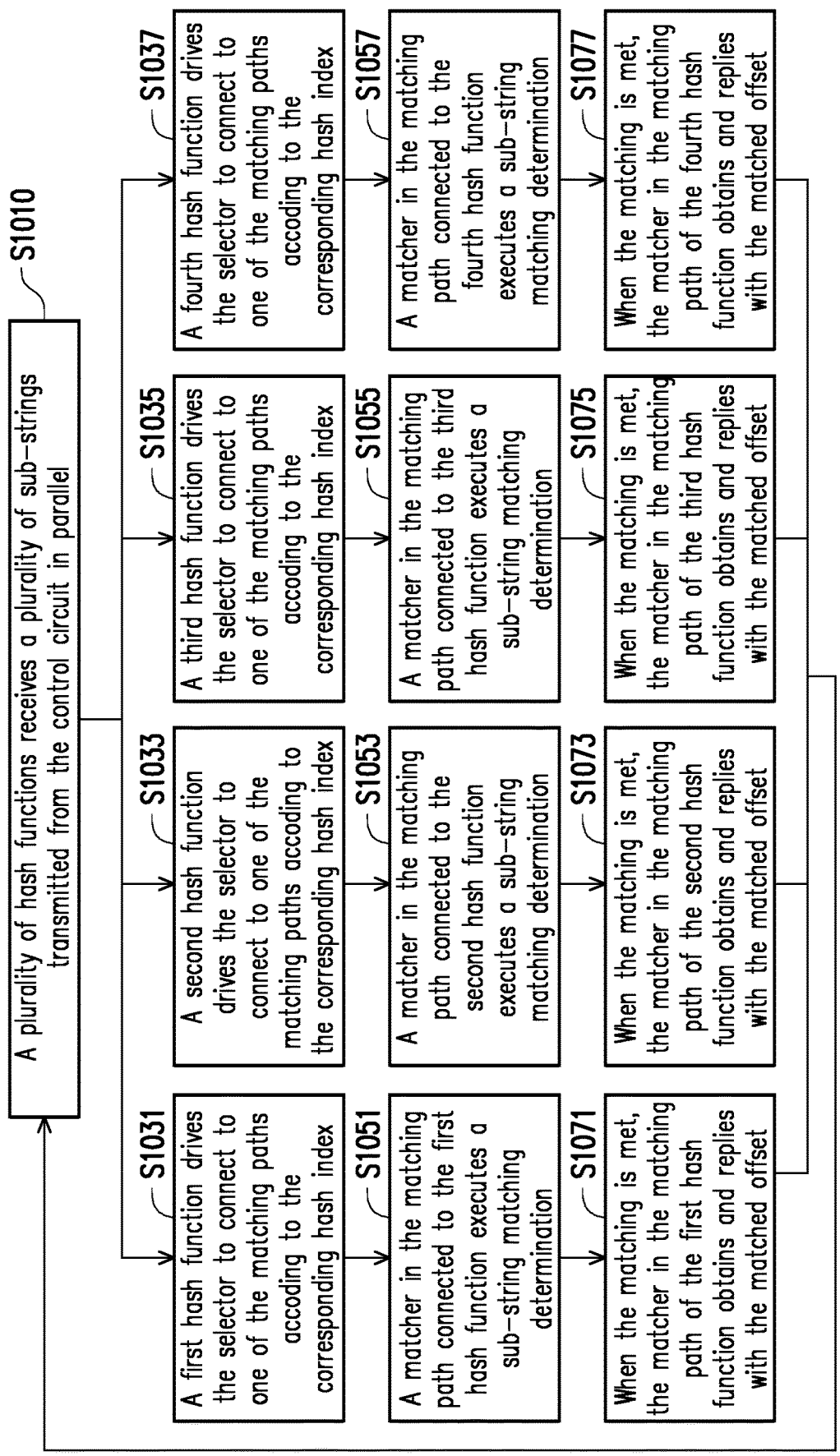
FIG. 10 is a flowchart illustrating a hash matching method according to an embodiment of the invention.

FIG. 10 is a flowchart illustrating a hash matching method according to an embodiment of the invention. With reference to FIG. 8 and FIG. 10, the hash functions 810_1 to 810_4 receive a plurality of substrings transmitted from the control circuit 240 in parallel (step S1010). Next, the hash function 810_1 maps the received sub string to the hash index, and drives the selector 830 to connect itself to one of the matching paths according to the hash index (step S1031). The hash function 810_2 maps the received substring to the hash index, and drives the selector 830 to connect itself to one of the matching paths according to the hash index (step S1033). The hash function 810_3 maps the received substring to the hash index, and drives the selector 830 to connect itself to one of the matching paths according to the hash index (step S1035). The hash function 810_4 maps the received substring to the hash index, and drives the selector 830 to connect itself to one of the matching paths according to the hash index (step S1037). It should be noted here that in steps S1031, S1033, S1035, S1037, at least two of the hash functions 810_1 to 810_4 may be connected to the same matching path, and may push the hash requests including the substrings into the FIFO queue in the same matching path.

Next, when determining that the hash table does not include the substring received by the hash function 810_1 (step S1051), the matcher (e.g., the matchers 870_1, 870_2, 870_3 or 870_4) in the matching path connected to the hash function 810_1 transmits the "no match" information to the control circuit 240. Next, when determining that the hash table includes the substring received by the hash function 810_1 (step S1051), the matcher in the matching path connected to the hash function 810_1 transmits the "match" information and the matched offset corresponding to the substring in the hash table to the control circuit 240 (step S1071). When determining that the hash table does not include the substring received by the hash function 810_2 (step S1053), the matcher (e.g., the matchers 870_1, 870_2, 870_3 or 870_4) in the matching path connected to the hash function 810_2 transmits the "no match" information to the control circuit 240. When determining that the hash table includes the substring received by the hash function 810_2 (step S1053), the matcher in the matching path connected to the hash function 810_2 transmits the "match" information and the matched offset corresponding to the substring in the hash table to the control circuit 240 (step S1073). When determining that the hash table does not include the substring received by the hash function 810_3 (step S1055), the matcher (e.g., the matchers 870_1, 870_2, 870_3 or 870_4) in the matching path connected to the hash function 810_3 transmits the "no match" information to the control circuit 240. When determining that the hash table includes the substring received by the hash function 810_3 (step S1055), the matcher in the matching path connected to the hash function 810_3 transmits the "match" information and the matched offset corresponding to the substring in the hash table to the control circuit 240 (step S1075). When determining that the hash table does not include the substring received by the hash function 810_4 (step S1057), the matcher (e.g., the matchers 870_1, 870_2, 870_3 or 870_4) in the matching path connected to the hash function 810_4 transmits the "no match" information to the control circuit 240. When determining that the hash table includes the substring received by the hash function 810_4 (step S1057), the matcher in the matching path connected to the hash function 810_4 transmits the "match" information and the matched offset corresponding to the substring in the hash table to the control circuit 240 (step S1077).

It should be noted here that when the FIFO queue of one matching path contains two or more hash requests, the matcher of that matching path performs aforementioned determination according to a sequence in which the hash requests arrive. For example, when the FIFO queue of one matching path includes the hash requests of the hash functions 810_1 and 810_2 and the hash request of the hash function 810_1 arrives earlier, the execution of steps S1031, S1051 and S1071 is earlier than the execution of steps S1033, S1053 and S1073.

For descriptive convenience, it is assumed below that the substring corresponding to one instance has a length n of 3 characters. For the hash matching operation of a plurality of hash matching paths shown in FIG. 8, the issuance pointer moves backwards over 4 characters each time (i.e., P=4) to sequentially obtain 6 characters in the string to be compressed from the look-ahead buffer 280 as 4 substrings of 4 instances. Here, each substring sequentially uses each one of the first 4 characters among the 6 characters as the start character. The 4 substrings are pushed into the 4 hash functions 810_1 to 810_4 shown in FIG. 8 for the hash calculation. However, when there are a large number of consecutive identical characters in the string to be compressed, while this large number of consecutive identical characters will enter the same hash bank and cause serious conflicts on the hash bank, the hash matching paths corresponding to several other hash banks will be idle. With respect to this issue, three solutions are introduced as follows.

The First Solution:

First, a string to be compressed including Q characters is extracted by the extraction unit 220 and stored to the look-ahead buffer 280; P instances are issued in parallel from the look-ahead buffer 280 in each issue cycle by the control circuit 240. Here, each of the instances sequentially corresponds to a substring using each character of consecutive P characters in the string to be compressed as a start character. Q and P are positive integers greater than 1, and Q is greater than P. The following description are provided with Q=16, P=4 and n=3 (i.e., the substring corresponding to each instance includes 3 characters) as an example. However, the invention is not limited thereto, and P, Q, and n may also be other values. The control circuit 240 determines whether 4 substrings corresponding to 4 instances issued in one clock cycle (issue cycle) are identical to each other. In an embodiment, the control circuit 240 can determine whether the 4 substrings are identical to each other by determining whether 6 characters (as one substring is composed of consecutive 3 characters obtained in sequence, the 6 characters will form 4 substrings in total) obtained in one clock cycle (issue cycle) are identical to each other. When the substrings corresponding to the 4 instances issued in one issue cycle (e.g., an issue cycle T1) are identical to each other, the control circuit 240 sends a first instance and a second instance of the 4 instances to the string matching processing pipeline 22 for a matching operation and does not send the remaining instances of these instances to the string matching processing pipeline 22. In consecutive issue cycles after the issue cycle T1, the control circuit 240 does not send any of the 4 instances to the string matching processing pipeline 22 until the substrings corresponding to the 4 instances are not identical to each other. In an embodiment, when the substrings corresponding to the 4 instances are not identical to each other, the control circuit 240 can send each of the 4 instances to the string matching processing pipeline 22 for the matching operation. In another embodiment, in the consecutive issue cycles after the issue cycle T1, the control circuit 240 does not send any of the 4 instances to the string matching processing pipeline 22 until the matched length of the second instance reaches the maximum matched length, such as 288 bytes. In other words, in the case of the large number of repeating characters, unless the repeating characters are completely handled or the matched length of the second instance reaches the maximum matched length, the control circuit 240 will not send the instances corresponding to the substrings composed of the repeating characters to the string matching processing pipeline 22. According to the embodiment of FIG. 6, in certain compression algorithms, the maximum matched length max_match is 258 bytes (i.e., the substring length (3 bytes) plus 255 bytes).

Figure 11:
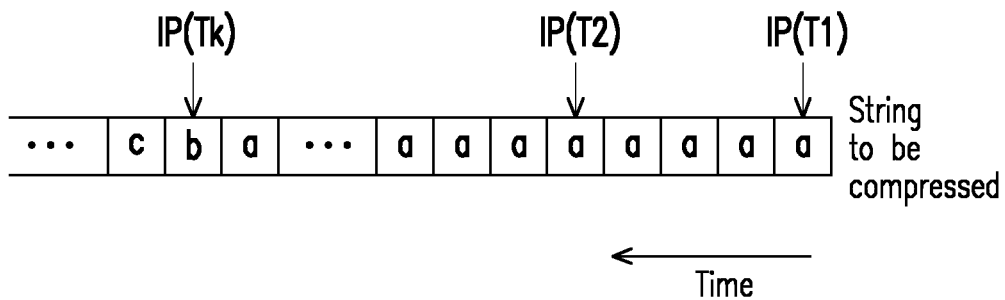
FIG. 11 illustrates a specific example of a string to be compressed.

For example, FIG. 11 illustrates a specific example of a string to be compressed. In FIG. 11, the horizontal axis indicates time; IP(T1) indicates a position pointed by an issuance pointer IP in an issue cycle T1; IP(T2) indicates a position pointed by the issuance pointer IP in an issue cycle T2; and IP(Tk) indicates a position pointed by the issuance pointer IP in an issue cycle Tk. In the example shown in FIG. 11, there are a large number of consecutive identical characters "a" in the string to be compressed. The control circuit 240 can obtain 6 characters "a" from the position pointed by the issuance pointer IP in the issue cycle T1, that is, all the 4 substrings issued in T1 are "aaa". As can be found by the control circuit 240, because the 4 substrings issued in the issue cycle T1 are identical to each other, the control circuit 240 can send the instances corresponding to the first substring "aaa" and the second substring "aaa" to the string matching processing pipeline 22 for the matching operation, but does not send the instances corresponding to the third substring "aaa" and the fourth substring "aaa" to the string matching processing pipeline 22. The method in this embodiment does not limit the matching method used by the string matching processing pipeline 22. The following description is provided with the hash-based string matching method in FIG. 3 to FIG. 7 as an example. The first substring "aaa" obtained in the issue cycle T1 will enter the dictionary (the sliding window of the data register 210), and the longest string matcher 260 will perform the longest match (LM) comparison on the second substring "aaa" obtained in the issue cycle T1 to generate the match pair.

In the consecutive issue cycles after the issue cycle T1 (e.g., the issue cycle T2 shown in FIG. 11), the control circuit 240 does not send any of the 4 instances to the string matching processing pipeline 22 until the substrings associated with these instances are not identical to each other. For instance, because the 4 substrings issued in the issue cycle Tk by the control circuit 240 according to the issuance pointer are not identical to each other, the control circuit 240 will send each of the instances associated with the 4 substrings obtained in the issue cycle Tk to the string matching processing pipeline 22 for the matching operation. Another timing for resuming the matching is in an issue cycle Tn (not illustrated), in which the matched length of the second instance reaches the maximum matched length max_match. That is to say, after multiple consecutive issue cycles after the issue cycle T1, it is assumed that the matched length of the second instance reaches the maximum matched length max_match (e.g., 258 bytes). Then, in the issue cycle Tn in which the maximum matched length max_match is reached, the first and the second instances of the 4 instances issued in that issue cycle are re-sent to the string matching processing pipeline 22 for the matching operation. In another embodiment, before the instances are issued, the step of determining whether the P substrings corresponding to the 4 instances issued in the issue cycle Tn are identical to each other is further performed.

The Second Solution:

The look-ahead buffer 280 can additionally be configured with a repeat flag. Here, one repeat flag (RF) is correspondingly stored in the look-ahead buffer 280 for each character in the string to be compressed. First, a string to be compressed including Q characters is extracted by the extraction unit 220 and stored to the look-ahead buffer 280, and one repeat flag (RF) is correspondingly stored in the look-ahead buffer 280 for each character of the Q characters. P instances are issued in parallel from the look-ahead buffer 280 in each issue cycle by the control circuit 240. Here, each of the instances sequentially corresponds to a substring using each character of consecutive P characters in the string to be compressed as a start character. Q and P are positive integers greater than 1, and Q is greater than P. The following description are provided with Q=16, P=4 and n=3 (i.e., the substring corresponding to each instance includes 3 characters) as an example. However, the invention is not limited thereto, and P, Q, and n may also be other values. The control circuit 240 determines whether 4 substrings corresponding to 4 instances issued in one clock cycle (issue cycle) are identical to each other. In an embodiment, the control circuit 240 can determine whether the 4 substrings are identical to each other by determining whether 6 characters (i.e., 4 substrings in total) obtained in one clock cycle (issue cycle) are identical to each other. When the 4 substrings corresponding to the 4 instances are identical to each other, the control circuit 240 can set the repeat flags of 3 start characters of 3 substrings corresponding to the last 3 instances among the 4 instances to a set state (e.g., by setting the repeat flags to "true"). The repeat flag in the set state indicates that the current character is identical to the previous character. In an embodiment, if the 6 characters (i.e., the 4 substrings) obtained in one clock cycle (issue cycle) are identical to each other, the repeat flags of the second, the third and the fourth characters are set to "true". The repeat flags may be provided to the control circuit 240 and used in the retirement processing operation. In an embodiment, when the 4 substrings corresponding to the 4 instances are not identical to each other, the control circuit 240 can maintain the repeat flags of all the characters of the substring of each of the 4 instances at an initial state (e.g., initially, the repeat flags are set to a default value "false").

The hash request operation of the control circuit 240 can send an instance in which the repeat flag of any character of the 4 instances is the initial state (i.e., not set to the set state) to the string matching processing pipeline 22 for the matching operation, and does not send an instance in which the repeat flags of all the characters that are set to the set state to the string matching processing pipeline 22. The control circuit 240 can counts a number of the consecutive repeat flags set to the set state to obtain a consecutive repeat count during the data reply processing operation of FIG. 6 or during the retirement processing operation of FIG. 7. The control circuit 240 can update the matched length of the instance by the consecutive repeat count. Specifically, in an embodiment, in step S630 in the data reply processing operation of FIG. 6, the length L calculated by the longest string matcher may be updated to the length L calculated by the longest string matcher 260 plus aforesaid consecutive repeat count. In another embodiment, in step S753 in the retirement processing operation of FIG. 7, the matched length L may be updated to the length L output by the longest string matcher 260 after the operation of FIG. 6 plus aforesaid consecutive repeat count, and then outputted to the formatter 270.

Figure 12:
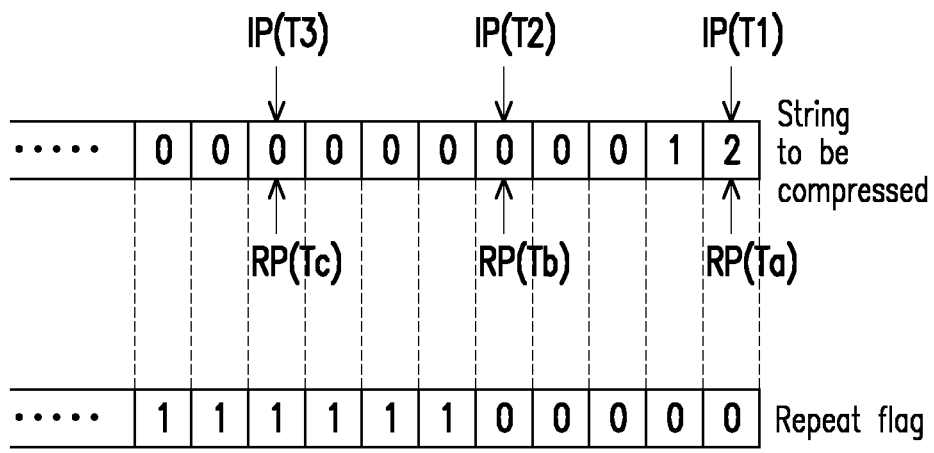
FIG. 12 illustrates another specific example of a string to be compressed.

For example, FIG. 12 illustrates another specific example of a string to be compressed. In FIG. 12, the horizontal axis indicates time; IP(T1) indicates a position pointed by an issuance pointer IP in an issue cycle T1; IP(T2) indicates a position pointed by the issuance pointer IP in an issue cycle T2; IP(T3) indicates a position pointed by the issuance pointer IP in an issue cycle T3; RP(Ta) indicates a position pointed by a retirement pointer RP in an issue cycle Ta; RP(Tb) indicates a position pointed by the retirement pointer RP in an issue cycle Tb; and RP(Tc) indicates a position pointed by the retirement pointer RP in an issue cycle Tc. In the example shown in FIG. 12, there are a large number of consecutive identical characters "0" in the string to be compressed. The control circuit 240 can obtain 6 characters "210000" at the position pointed by the issuance pointer IP in the issue cycle T1, i.e., obtain 4 substrings respectively being "210", "100", "000" and "000". Because the 4 substrings obtained in the issue cycle T1 by the control circuit 240 according to the issuance pointer IP are not completely identical to each other, the control circuit 240 can set 4 repeat flags associated with these substrings to "0" (the initial state). In the issue cycle T1, when performing the hash request operation of FIG. 4, the control circuit 240 can send instances in which the repeat flag of any character being maintained at "0" to the string matching processing pipeline 22 for the matching operation (specifically, sending hash request to the hash matcher 250). That is to say, the repeat flags of the substrings "210", "100", "000", and "000" corresponding to the 4 instances issued in T1 are "000", "000", "000" and "001" respectively. That is, the four instances all have the repeat flag of the character being 0, so the 4 instances will be sent to the string matching processing pipeline 22 for the matching operation.

The control circuit 240 can obtain 6 characters "000000" at the position pointed by the issuance pointer IP in the issue cycle T2, i.e., obtain 4 substrings all being "000". As can be found by the control circuit 240, because the 4 substrings obtained in the issue cycle T2 are identical to each other, the control circuit 240 can set the repeat flags of the start characters of the last 3 substrings among the substrings to "1" (the set state). In detail, because the repeat flags of the first substring "000" pointed by the issuance pointer IP in the issue cycle T2 are "011", the first substring "000" will be sent to the string matching processing pipeline 22 for the matching operation (specifically, sending the hash request to the hash matcher 250), so as to push the first substring "000" obtained in the issue cycle T2 into the dictionary (the sliding window of the data register 210). The repeat flags associated with the remaining substrings obtained in the issue cycle T2 will be set to "111", i.e., the repeat flags of all the characters of the remaining substrings are all set to the set state, as shown in FIG. 12. Because the control circuit 240 does not send the hash request for the instance in which the repeat flags are set to "111" when performing the hash request operation, therefore conflicts on the hash bank and unnecessary matching operation may be reduced to improve the matching efficiency.

It should be noted that, in other application cases, if the repeat flag associated with the character previous to the position pointed by the issuance pointer IP in the issue cycle T2 is already set to "1" (which means that the same substring "000" has already been pushed into the dictionary at the previous time), the repeat flag of the character at the position pointed by the issue cycle IP in the issue cycle T2 may be set to "1". That is to say, the repeat flag of the start character of the first instance of the 4 instances is also set to "1". That is to say, the control circuit 240 can set all the repeat flags of all the characters of the 4 substrings obtained in the issue cycle T2 to "1" (the set state).

When performing the retirement operation of FIG. 7, the control circuit 240 can count the number of consecutive repeat flags set to "1" (the set state) to obtain the consecutive repeat count value. With the retirement pointer RP shown in FIG. 12 as an example, because the repeat flags of consecutive 4 characters at the position pointed by the retirement pointer RP in the issue cycle Ta are all "0", the consecutive repeat count of the retirement processing operation is maintained at an initial value 0. Because the repeat flags of consecutive 4 characters at the position pointed by the retirement pointer RP in the issue cycle Tb are "0", "1", "1" and "1", respectively, the consecutive repeat count of the retirement processing operation is 3 (consecutive 3 repeat flags are set to "1"). Because the repeating flags of consecutive 4 characters at the position pointed by the retirement pointer RP in the issue cycle Tc are "1", "1", "1" and "1", respectively (consecutive 4 repeat flags are set to "1"), the consecutive repeat count of the retirement processing operation is 3+4=7. The process above repeats until the repeating flag set to "1" no longer appears continuously. The control circuit 240 can update the matched length L of the instance by the consecutive repeat count. Specifically, in step S753 in the retirement processing operation of FIG. 7, the matched length L may be updated to the length L output by the longest string matcher 260 after the operation of FIG. 6 plus aforesaid consecutive repeat count, and then outputted to the formatter 270. It should be noted that, the method in this embodiment does not limit the specific matching method used by the string matching processing pipeline 22. The foregoing description is provided with the hash-based string matching method in FIG. 3 to FIG. 7 as an example, but the invention is not limited thereto.

The Third Solution:

First, a string to be compressed including Q characters is extracted by the extraction unit 220 and stored to the look-ahead buffer 280; P instances are issued in parallel from the look-ahead buffer 280 in each issue cycle by the control circuit 240. Here, each of the instances sequentially corresponds to a substring using each character of consecutive P characters in the string to be compressed as a start character. Q and P are positive integers greater than 1, and Q is greater than P. The following description are provided with Q=16, P=4 and n=3 (i.e., the substring corresponding to each instance includes 3 characters) as an example. However, the invention is not limited thereto, and P, Q, and n may also be other values. The control circuit 240 determines whether 4 substrings corresponding to 4 instances issued in one clock cycle (issue cycle) are identical to each other. In an embodiment, the control circuit 240 can determine whether the 4 substrings are identical to each other by determining whether 6 characters (i.e., 4 substrings in total) obtained in one clock cycle (issue cycle) are identical to each other. When the 4 substrings corresponding to the 4 instances are identical to each other, the control circuit 240 can send one of the 4 instances to the string matching processing pipeline 22 for the matching operation, but does not send the remaining 3 instances of the 4 instances to the string matching processing pipeline 22. When the 4 substrings corresponding to the 4 instances are not identical to each other, the control circuit 240 can send each of the 4 instances to the string matching processing pipeline 22 for the matching operation. The difference from the first solution mentioned above is described as follows. First, when the 4 substrings are identical to each other, only 1 instance among the 4 instance is sent to the string matching processing pipeline 22 for the matching operation. In the first solution, 2 instances are sent to the string matching processing pipeline 22 for the matching operation in order to form the match pair. In addition, when the consecutive 4 substrings corresponding to the 4 instances are identical in the subsequent issue cycles, in the present solution, 1 instance among the 4 identical instances needs to be sent to the string matching processing pipeline 22 for the matching operation in each issue cycle. On other hand, in the first solution, no instance is issued in the subsequent issue cycles until different substring appears or the maximum matched length is reached. The control circuit 240 stores all the instances to the intermediary buffer 230. Here, the state of the instance not being sent to the string matching processing pipeline 22 is the no match state in the intermediary buffer 230.

Figure 13:
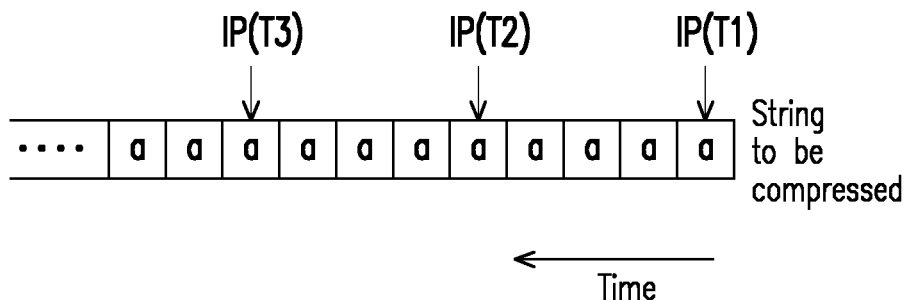
FIG. 13 illustrates yet another specific example of a string to be compressed.

For instance, FIG. 13 illustrates yet another specific example of a string to be compressed. In FIG. 13, the horizontal axis indicates time; IP(T1) indicates a position pointed by an issuance pointer IP in an issue cycle T1; IP(T2) indicates a position pointed by the issuance pointer IP in an issue cycle T2; and IP(T3) indicates a position pointed by the issuance pointer IP in an issue cycle T3. In the example shown in FIG. 13, there are a large number of consecutive identical characters "a" in the string to be compressed. The control circuit 240 can obtain 6 characters "a" from the position pointed by the issuance pointer IP in the issue cycle T1, that is, all the 4 substrings issued in T1 are "aaa". As can be found by the control circuit 240, because the 4 substrings issued in the issue cycle T1 are identical to each other, the control circuit 240 can send the first instance issued in the issue cycle T1 to the string matching processing pipeline 22 for the matching operation, but does not send the remaining 3 instances issued in the issue cycle T1 to the string matching processing pipeline 22 for the matching operation. By analogy, because the 4 substrings corresponding to the 4 instances issued in the issue cycle T2 are also identical to each other, the control circuit 240 can simply send the first instance issued in the issue cycle T2 to the string matching processing pipeline 22 for the matching operation, but does not send the remaining 3 instances issued in the issue cycle T2 to the string matching processing pipeline 22 for the matching operation.

Based on different design requirements, blocks of the extraction unit 220, the intermediary buffer 230, the control circuit 240, the string matching processing pipeline 22 (e.g., including the hash matcher 250 and the longest string matcher 260), the formatter 270 and/or the look-ahead buffer 280 may be implemented in form of hardware, firmware, software or a combination of the three.

In form of hardware, the blocks of the extraction unit 220, the intermediary buffer 230, the control circuit 240, the string matching processing pipeline 22 (e.g., including the hash matcher 250 and the longest string matcher 260), the formatter 270 and/or the look-ahead buffer 280 may be implemented as logical circuits on an integrated circuit. Related functions of the extraction unit 220, the intermediary buffer 230, the control circuit 240, the string matching processing pipeline 22 (e.g., including the hash matcher 250 and the longest string matcher 260), the formatter 270 and/or the look-ahead buffer 280 may be implemented in form of hardware by using hardware description languages (e.g., Verilog HDL or VHDL) or other suitable programming languages. For instance, the related functions of the extraction unit 220, the intermediary buffer 230, the control circuit 240, the string matching processing pipeline 22 (e.g., including the hash matcher 250 and the longest string matcher 260), the formatter 270 and/or the look-ahead buffer 280 may be implemented as various logic blocks, modules and circuits in one or more controllers, a microcontroller, a microprocessor, an application-specific integrated circuits (ASIC), a digital signal processors (DSP), a field programmable gate array (FPGA) and/or other processing units.

In form of software/firmware, the related functions of the extraction unit 220, the intermediary buffer 230, the control circuit 240, the string matching processing pipeline 22 (e.g., including the hash matcher 250 and the longest string matcher 260), the formatter 270 and/or the look-ahead buffer 280 may be implemented as programming codes. For example, the related functions of the extraction unit 220, the intermediary buffer 230, the control circuit 240, the string matching processing pipeline 22 (e.g., including the hash matcher 250 and the longest string matcher 260), the formatter 270 and/or the look-ahead buffer 280 may be implemented by using common programming languages (e.g., C or C++) or other suitable programming languages. The programming codes may be recorded/stored in a recording medium. The recording medium includes, for example, a read only memory (ROM), a storage device and/or a random access memory (RAM). A computer, a central processing unit (CPU), a controller, a microcontroller or a microprocessor can read and execute the programming codes from the recording medium to achieve the related functions. A "non-transitory computer readable medium" (including a tape, a disk, a card, a semiconductor memory, a programmable logic circuits, etc.) may be used as the recording medium. Moreover, the programming codes may also be provided to the computer (or the CPU) via any transmission medium (a communication network or a broadcast wave). The communication network is, for example, Internet, a wired communication, a wireless communication or other communication medium.

In summary, the accelerated compression method and the accelerated compression apparatus 20 described in the embodiments of the invention can determine whether multiple substrings corresponding to multiple instances are identical to each other. When the substrings are identical to each other, the control circuit 240 can stop sending a part (or all) of the substrings to the string matching processing pipeline 22 for the matching operation. As a result, the accelerated compression method and the accelerated compression apparatus can solve the issue of unnecessary and redundant matching operations caused by the substrings with the same content being sent to the string matching processing pipeline 22.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An accelerated compression method, implemented in an acceleration compression apparatus comprising a look-ahead buffer and a string matching processing pipeline, the accelerated compression method comprising:

extracting a string to be compressed from a data register and storing the string to be compressed to the look-ahead buffer, wherein the string to be compressed comprises Q characters; and issuing P instances in parallel from the look-ahead buffer in each of issue cycles, wherein each of the P instances sequentially corresponds to a substring using each character of consecutive P characters in the string to be compressed as a start character, wherein Q and P are positive integers greater than 1, and Q is greater than P, wherein when the P substrings corresponding to the P instances issued in a first issue cycle are identical to each other, a first instance and a second instance of the P instances are sent to the string matching processing pipeline for a matching operation and the remaining instances of the P instances are not sent to the string matching processing pipeline; and in consecutive issue cycles after the first issue cycle, none of the P instances is sent to the string matching processing pipeline until the P substrings corresponding to the P instances are not identical to each other.

2. The accelerated compression method according to claim 1, wherein when the P substrings corresponding to the P instances issued in the first issue cycle are not identical to each other, each of the P instances is sent to the string matching processing pipeline for the matching operation.

3. The accelerated compression method according to claim 1, wherein in the consecutive issue cycles after the first issue cycle, none of the P instances is sent to the string matching processing pipeline until a matched length of the second instance reaches a maximum matched length.

4. The accelerated compression method according to claim 1, wherein the method further comprises:

storing all the issued instances to an intermediary buffer, wherein each of the instances comprises a state, a matched length and a matched offset of the corresponding substring.

5. The accelerated compression method according to claim 1, wherein the string matching processing pipeline further comprises a hash matcher and a longest string matcher, and the matching operation further comprises:

for each of the instances, sending a hash request to the hash matcher, and sending a data request to the longest string matcher when a first reply transmitted from the hash matcher contains match information;

updating a state, a matched length and a matched offset of the instance according to determining whether a length contained in a second reply transmitted from the longest string matcher is less than a maximum matched length; and outputting a result to a formatter according to an original sequence of the substrings corresponding to the issued instances in the string to be compressed and according to the state, the matched length and the matched offset of each of the instances so that the formatter accordingly compresses the string to be compressed.

6. The accelerated compression method according to claim 5, further comprising:

when the first reply contains no match information, updating the state of the instance to a no match state; and when the first reply contains the match information, further updating the state of the instance to a data request state, updating the matched length of the instance to a length of the substring, and updating the matched offset of the instance to an offset in the first reply.

7. The accelerated compression method according to claim 5, wherein when the length contained by the second reply is less than the maximum matched length, the state of the instance is updated to a partial match state, and the matched length of the instance is updated by the length; and when the length contained by the second reply is not less than the maximum matched length, the state of the instance is updated to a full match state, the matched length of the instance is updated by the maximum matched length, and another data request corresponding to the instance is sent to the longest string matcher to continue a subsequent string comparison.

8. The accelerated compression method according to claim 5, wherein in the step of outputting the result to the formatter, when the state of the instance is a no match state, the result contains a character in the instance; and when the state of the instance is a partial match state or a full match state, the result contains the matched length and the matched offset in the instance.

9. The accelerated compression method according to claim 5, wherein the original sequence of the substrings corresponding to the instance in the string to be compressed is controlled by a retirement pointer, wherein the retirement pointer sequentially jumps backwards over P characters in each of the issue cycles.

10. The accelerated compression method according to claim 1, wherein a sequence for issuing the instances is controlled by an issuance pointer, wherein the issuance pointer sequentially jumps backwards over P characters in each of the issue cycles.

11. An accelerated compression apparatus, comprising:

a look-ahead buffer, configured to store a string to be compressed extracted from a data register, wherein the string to be compressed comprises Q characters, P instances are issued in parallel from the look-ahead buffer in each of issue cycles, and each of the P instances sequentially corresponds to a substring using each character of consecutive P characters in the string to be compressed as a start character, wherein Q and P are positive integers greater than 1, and Q is greater than P;

a string matching processing pipeline, coupled to the look-ahead buffer; and a control circuit, wherein when the P substrings corresponding to the P instances issued in a first issue cycle are identical to each other, the control circuit sends a first instance and a second instance of the P instances to the string matching processing pipeline for a matching operation and does not send the remaining instances of the P instances to the string matching processing pipeline; and in consecutive issue cycles after the first issue cycle, the control circuit does not send any of the P instances to the string matching processing pipeline until the P substrings corresponding to the P instances are not identical to each other.

12. The accelerated compression apparatus according to claim 11, wherein when the P substrings corresponding to the P instances issued in the first issue cycle are not identical to each other, the control circuit sends each of the P instances to the string matching processing pipeline for the matching operation.

13. The accelerated compression apparatus according to claim 11, wherein in the consecutive issue cycles after the first issue cycle, the control circuit sends none of the P instances to the string matching processing pipeline until a matched length of the second instance reaches a maximum matched length.

14. The accelerated compression apparatus according to claim 11, further comprising:
- an intermediary buffer, configured to store all the issued instances, wherein each of the instances comprises a state, a matched length and a matched offset of the corresponding substring.

15. The accelerated compression apparatus according to claim 11, wherein the string matching processing pipeline further comprises a hash matcher and a longest string matcher, and in the matching operation,
- for each of the instances, the control circuit sends a hash request to the hash matcher, and sends a data request to the longest string matcher when a first reply transmitted from the hash matcher contains match information;
- the control circuit updates a state, a matched length and a matched offset of the instance according to determining whether a length contained in a second reply transmitted from the longest string matcher is less than a maximum matched length; and
- the control circuit outputs a result to a formatter according to an original sequence of the substrings corresponding to the issued instances in the string to be compressed and according to the state, the matched length and the matched offset of each of the instances so that the formatter accordingly compresses the string to be compressed.

16. The accelerated compression apparatus according to claim 15, wherein
- when the first reply contains no match information, the control circuit updates the state of the instance to a no match state; and
- when the first reply contains the match information, the control circuit further updates the state of the instance to a data request state, updates the matched length of the instance to a length of the substring, and updates the matched offset of the instance to an offset in the first reply.

17. The accelerated compression apparatus according to claim 15, wherein
- when the length contained by the second reply is less than the maximum matched length, the control circuit updates the state of the instance to a partial match state, and updates the matched length of the instance by the length; and
- when the length contained by the second reply is not less than the maximum matched length, the control circuit updates the state of the instance to a full match state, updates the matched length of the instance by the maximum matched length, and sends another data request corresponding to the instance to the longest string matcher to continue a subsequent string comparison.

18. The accelerated compression apparatus according to claim 15, wherein in the matching operation,
- when the state of the instance is a no match state, the result contains a character in the instance; and
- when the state of the instance is a partial match state or a full match state, the result contains the matched length and the matched offset in the instance.

19. The accelerated compression apparatus according to claim 15, wherein the original sequence of the substrings corresponding to the instance in the string to be compressed is controlled by a retirement pointer, wherein the retirement pointer sequentially jumps backwards over P characters in each of the issue cycles.

20. The accelerated compression apparatus according to claim 11, wherein a sequence for issuing the instances is controlled by an issuance pointer, wherein the issuance pointer sequentially jumps backwards over P characters in each of the issue cycles.

* * * * *